(12) United States Patent
Arasawa et al.

(10) Patent No.: US 7,952,100 B2
(45) Date of Patent: May 31, 2011

(54) SEMICONDUCTOR DEVICE

(75) Inventors: Ryo Arasawa, Kanagawa (JP); Aya Miyazaki, Kanagawa (JP); Shigeharu Monoe, Tochigi (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 426 days.

(21) Appl. No.: 11/898,749

(22) Filed: Sep. 14, 2007

(65) Prior Publication Data
US 2008/0073647 A1 Mar. 27, 2008

(30) Foreign Application Priority Data

Sep. 22, 2006 (JP) ................................ 2006-256902

(51) Int. Cl.
*H01L 27/14* (2006.01)
(52) U.S. Cl. .......................................... 257/72; 257/66
(58) Field of Classification Search .................. 257/66, 257/72
See application file for complete search history.

(56) References Cited

U.S. PATENT DOCUMENTS

| | | | |
|---|---|---|---|
| 5,879,741 A | 3/1999 | Itoh | |
| 5,966,193 A | 10/1999 | Zhang et al. | |
| 6,261,634 B1 | 7/2001 | Itoh | |
| 6,542,205 B2 | 4/2003 | Ohtani et al. | |
| 6,583,472 B1 | 6/2003 | Shibata et al. | |
| 6,828,584 B2 | 12/2004 | Arao et al. | |
| 7,045,438 B2 | 5/2006 | Yamazaki et al. | |
| 7,078,277 B2 | 7/2006 | Arao et al. | |
| 7,098,086 B2 | 8/2006 | Shibata et al. | |
| 7,253,038 B2 | 8/2007 | Arao et al. | |
| 2003/0082889 A1 | 5/2003 | Maruyama et al. | |
| 2005/0167674 A1 | 8/2005 | Shibata et al. | |
| 2006/0027817 A1 | 2/2006 | Yamazaki et al. | |

FOREIGN PATENT DOCUMENTS

| | | |
|---|---|---|
| JP | 2003-204049 | 7/2003 |
| JP | 2006-232449 | 9/2006 |

*Primary Examiner* — Douglas M Menz
(74) *Attorney, Agent, or Firm* — Nixon Peabody LLP; Jeffrey L. Costellia

(57) ABSTRACT

An object is to provide a semiconductor device in which damages of an element such as a transistor are reduced even when physical force such as bending is externally applied to generate stress in the semiconductor device. A semiconductor device includes a semiconductor film including a channel formation region and an impurity region, which is provided over a substrate, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, and a third conductive film provided over the second interlayer insulating film so as to be electrically connected to the impurity region through an opening.

14 Claims, 28 Drawing Sheets

SEMICONDUCTOR DEVICE

BACKGROUND OF THE INVENTION

1. Field of the Invention

The present invention relates to a semiconductor device, in particular, a semiconductor device in which damages of an element such as a transistor provided in the semiconductor device are reduced even when a stress is applied.

2. Description of the Related Art

In recent years, a technique for providing an integrated circuit including a transistor or the like over a flexible substrate such as a plastic substrate has attracted attention (for example, Patent Document 1: Japanese Published Patent Application No. 2003-204049). A semiconductor device formed by providing an integrated circuit over a flexible substrate can be reduced in weight, cost, or the like as compared to the case of using a substrate such as a semiconductor substrate or a glass substrate. Since a flexible semiconductor device can be bent for example, it is expected to be applied to various fields and places (For example, Patent Document 2: Japanese Published Patent Application No. 2006-232449).

SUMMARY OF THE INVENTION

However, when force such as bending is externally applied to a semiconductor device including an integrated circuit provided with an element such as a transistor over a flexible substrate, stress caused in the semiconductor device might damage the element such as a transistor which is included in the semiconductor device and adversely affect characteristics of the element. Further, in the manufacturing process of the semiconductor device, the element such as a transistor is stressed and therefore the element might be damaged, which results in reducing the yield of products.

In view of the above problems, an object of the present invention is to provide a semiconductor device in which damages of an element such as a transistor are reduced even when force such as bending is externally applied to generate stress in the semiconductor device.

In the semiconductor device of the present invention, a film functioning as a protective film is provided in order to prevent the element such as a transistor from being damaged due to stress caused in the semiconductor device even when the semiconductor device is stressed by being applied with physical force such as bending in the manufacturing process of the semiconductor device or utilization after completion thereof. The protective film is provided so as to be bent between the elements such as transistors (so that stress is concentrated therebetween) when the semiconductor device is applied with physical force such as bending. Specifically, by providing the protective film over and under the element such as a transistor and in the vicinity thereof, concentration of stress on the element such as a transistor is suppressed.

Since a feature of the semiconductor device of the present invention is that the protective film is provided over and under a semiconductor film included in a transistor and in the vicinity thereof, the protective film may be provided so as to cover an end portion of the semiconductor film. The protective film may be provided so as to be in contact with the semiconductor film or so as not to be in contact with the semiconductor film with an insulating film interposed therebetween. Hereinafter, a specific structure of the semiconductor device of the present invention is described.

One semiconductor device of the present invention includes a semiconductor film including a channel formation region and an impurity region, which is provided over a substrate, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, and a third conductive film provided over the second interlayer insulating film, in which the third conductive film is electrically connected to the impurity region through an opening formed in the first interlayer insulating film and the second interlayer insulating film. Note that the word "overlap" in this specification refers to overlap when seen from a direction perpendicular to a surface of the substrate, and the second conductive film provided so as to overlap with part of the impurity region means that the second conductive film provided overlaps with part of the impurity region when seen from the direction perpendicular to the surface of the substrate.

Another semiconductor device of the present invention includes a semiconductor film including a channel formation region and an impurity region, which is provided over a substrate, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, and a third conductive film provided over the second interlayer insulating film, in which the third conductive film is electrically connected to the impurity region through an opening formed in the first interlayer insulating film, the second interlayer insulating film, and the second conductive film.

Another semiconductor device of the present invention includes a semiconductor film including a channel formation region and an impurity region, which is provided over a substrate, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, and a third conductive film provided over the second interlayer insulating film, in which the second conductive film is electrically connected to the impurity region through an opening formed in the first interlayer insulating film, and the third conductive film is electrically connected to the second conductive film through an opening formed in the second interlayer insulating film.

Another semiconductor device of the present invention includes a semiconductor film including a channel formation region, a first impurity region, and a second impurity region, which is provided over a substrate, a first conductive film provided over the channel formation region with a gate insulating film interposed therebetween, a second conductive film provided over the first impurity region so as to be in contact with the gate insulating film, an interlayer insulating film provided to cover the first conductive film and the second conductive film, and a third conductive film provided over the interlayer insulating film, in which the first conductive film and the second conductive film are formed of the same material, and the third conductive film is electrically connected to the first impurity region through an opening formed in the interlayer insulating film.

Another semiconductor device of the present invention includes a semiconductor film including a channel formation region, a first impurity region, and a second impurity region, which is provided over a substrate, a first conductive film provided over the channel formation region with a gate insulating film interposed therebetween, a second conductive film provided over the first impurity region so as to be in contact with the gate insulating film, an interlayer insulating film provided to cover the first conductive film and the second conductive film, and a third conductive film provided over the interlayer insulating film, in which the first conductive film and the second conductive film are formed of the same material, and the third conductive film is electrically connected to the first impurity region through an opening formed in the interlayer insulating film and the second conductive film.

Another semiconductor device of the present invention includes a semiconductor film including a channel formation region, a first impurity region, and a second impurity region, which is provided over a substrate, a first conductive film provided over the channel formation region with a gate insulating film interposed therebetween, a second conductive film provided so as to cover an end portion of the first impurity region and in contact with the first impurity region, an interlayer insulating film provided to cover the first conductive film and the second conductive film, and a third conductive film provided over the interlayer insulating film, in which the first conductive film and the second conductive film are formed of the same material, and the third conductive film is electrically connected to the second conductive film through an opening formed in the interlayer insulating film.

Another semiconductor device of the present invention includes an island-shaped protective film provided over a substrate, a semiconductor film including a channel formation region and an impurity region, which is provided over the protective film with an insulating film interposed therebetween, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, and a third conductive film provided over the second interlayer insulating film, in which the third conductive film is electrically connected to the impurity region through an opening formed in the first interlayer insulating film, the second interlayer insulating film, and the second conductive film.

Another semiconductor device of the present invention includes an island-shaped protective film provided over a substrate, a semiconductor film including a channel formation region and an impurity region, which is provided so as to partially overlap with the protective film with an insulating film interposed therebetween, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, and a third conductive film provided over the second interlayer insulating film, in which the whole channel formation region and the protective film overlap with each other, and the third conductive film is electrically connected to the impurity region through an opening formed in the first interlayer insulating film, the second interlayer insulating film, and the second conductive film.

Another semiconductor device of the present invention includes a protective film provided over a substrate, an insulating film provided over the protective film, a semiconductor film including a channel formation region and an impurity region, which is provided over the insulating film, a first conductive film provided over the channel formation region with a gate insulating film interposed therebetween, an interlayer insulating film provided to cover the first conductive film, and a second conductive film provided over the interlayer insulating film, in which the protective film is provided so as to surround the semiconductor film, and the second conductive film is electrically connected to the impurity region through an opening formed in the interlayer insulating film.

Another semiconductor device of the present invention includes a semiconductor film including a channel formation region and an impurity region, which is provided over a substrate, a first conductive film provided over the channel formation region with a gate insulating film interposed therebetween, a first interlayer insulating film provided to cover the first conductive film, a second conductive film provided over the first interlayer insulating film so as to overlap with at least part of the impurity region, a second interlayer insulating film provided over the second conductive film, a third conductive film provided over the second interlayer insulating film, a third interlayer insulating film provided to cover the third conductive film, and an island-shaped protective film provided over the third interlayer insulating film, in which the third conductive film is electrically connected to the impurity region through an opening formed in the first interlayer insulating film, the second interlayer insulating film, and the second conductive film, and the semiconductor film and the protective film overlap with each other.

Even when the semiconductor device is stressed in the manufacturing process of the semiconductor device or utilization after completion thereof, damages of the element can be prevented, and therefore the yield and reliability of the semiconductor device can be improved by providing the protective film over and under the element such as a transistor included in the semiconductor device and in the vicinity thereof.

DETAILED DESCRIPTION OF THE INVENTION

Figure 1A:
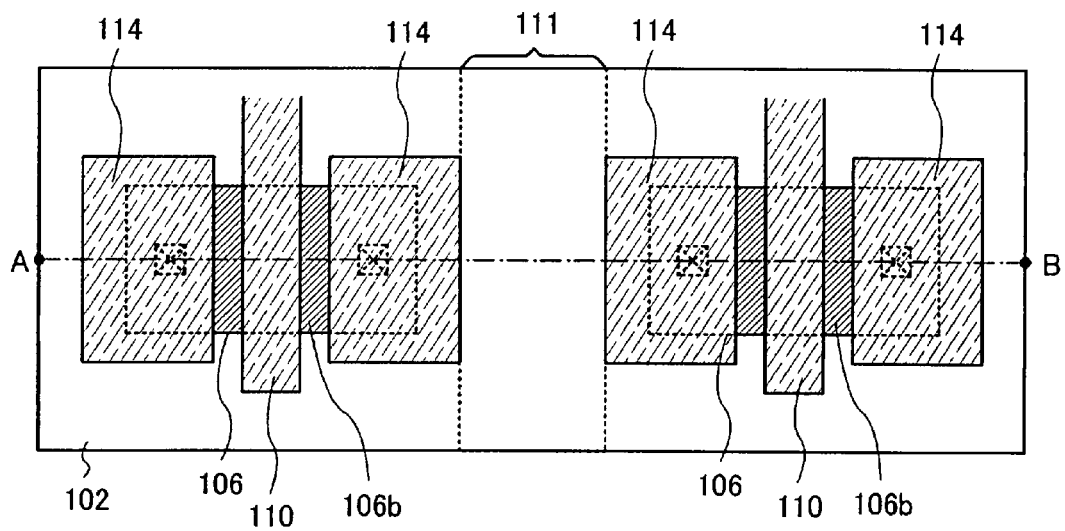
FIGS. 1A and 1B are views showing an example of a semiconductor device of the present invention.

Although the invention will be fully described by way of embodiment modes with reference to the accompanying drawings, it is to be understood by those skilled in the art that various changes and modifications can be made without departing from the spirit and scope of the invention. Therefore, the present invention should not be construed as being limited to the description in the following embodiment modes. Note that in the structure of the present invention described below, common portions are denoted by the same reference numerals in all diagrams, in some cases.

Embodiment Mode 1

In this embodiment mode, an example of the semiconductor device of the present invention is described with reference to drawings.

The semiconductor device of the present invention has a structure for preventing an element provided in the semiconductor device, such as a transistor, from being damaged even in the case where the semiconductor device is stressed by being applied with force such as bending. In this embodiment mode, as an example of the structure, the case is described in which a film functioning as a protective film is provided above a semiconductor film included in the transistor.

Figure 1B:
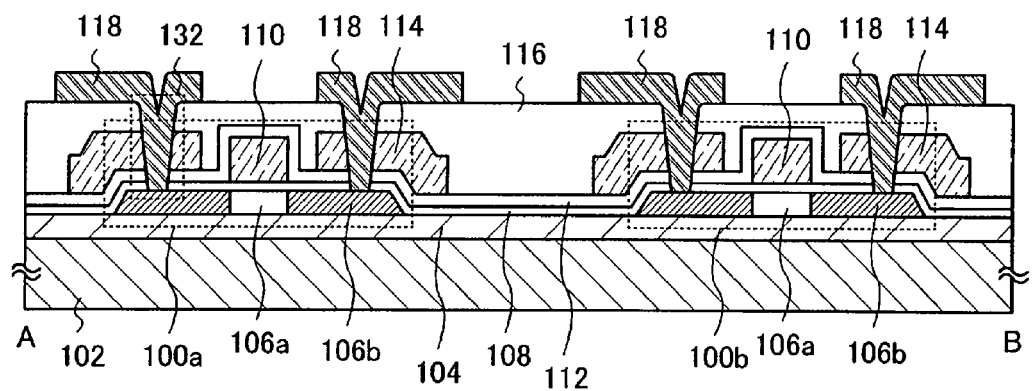

FIGS. 1A and 1B show an example of the semiconductor device described in this embodiment mode. Note that FIG. 1A shows a top plan view and FIG. 1B shows a cross-sectional view taken along a line A-B in FIG. 1A.

The semiconductor device shown in FIGS. 1A and 1B includes thin film transistors 100a and 100b each including at least a semiconductor film 106, a gate insulating film 108, and a first conductive film 110 functioning as a gate electrode, and second conductive films 114 functioning as protective films of the thin film transistors 100a and 100b. In FIGS. 1A and 1B, the second conductive films 114 are provided so as to overlap at least part of the semiconductor film 106 with the gate insulating film 108 and the insulating film 112 interposed therebetween. Here, the second conductive films 114 are provided so as to cover end portions of the semiconductor films 106.

The insulating film 112 is provided so as to cover the thin film transistors 100a and 100b, and an insulating film 116 is provided so as to cover the insulating film 112 and the second conductive films 114. In addition, third conductive films 118 capable of functioning as source and drain electrodes of the thin film transistors 100a and 100b are provided over the insulating film 116. Note that an example is shown here in which the thin film transistors 100a and 100b are provided over the substrate 102 with the insulating film 104 interposed therebetween.

The semiconductor films 106 each have a channel formation region 106a and an impurity regions 106b functioning as source and drain regions. The impurity regions 106b are separately provided with the channel formation region 106a interposed therebetween and electrically connected to the third conductive films 118 provided over the insulating film 116.

The second conductive films 114 are provided so as to overlap at least part of the impurity regions 106b in the semiconductor films 106 and can function as the protective films of the thin film transistors 100a and 100b. Thus, by provision of the second conductive films 114, the stress is concentrated in a region 111 (between the thin film transistors 100a and 100b) where an element such as a transistor is not formed (the semiconductor device is bent in the region 111) even in the case where the semiconductor device is stressed by, for example, being bent; therefore, damages and breakages of the thin film transistors 100a and 100b can be reduced.

Further, the second conductive films 114 are provided here so as to be in contact with the third conductive films 118 in openings 132. The openings 132 are formed in the second conductive films 114, thereby a region where the semiconductor film 106 and the second conductive film 114 overlap with each other can be increased. Note that the openings 132 are each formed in the gate insulating film 108, the insulating film 112, and the insulating film 116 in order to electrically connect the impurity region 106b of the semiconductor film 106 and the third conductive film 118, and in FIGS. 1A and 1B, the openings are formed in the second conductive films 114 as well as the gate insulating film 108, the insulating film 112, and the insulating film 116.

The second conductive films 114 are preferably provided so as to cover the end portions of the semiconductor films 106 (for example, end portions of the impurity regions 106b). By providing the second conductive films 114 so as to cover the semiconductor films 106 which is most easily damaged due to stress caused by physical force such as bending, in the thin film transistors 100a and 100b, it becomes possible to efficiently reduce damages of the semiconductor films 106 in the manufacturing process of the semiconductor device or utilization after completion thereof and thereby improve the yield and reliability of the semiconductor device. In particular, by increasing an area where the semiconductor film 106 and the second conductive film 114 overlap with each other (for example, by forming the openings 132 in the second conductive films), it becomes possible to efficiently reduce damages of the semiconductor films 106 even in the case where the semiconductor device is stressed by, for example, being bent and thereby improve the yield and reliability of the semiconductor device.

Note that the example is shown in which the openings are formed in the second conductive films 114 as well in the semiconductor device shown in FIGS. 1A and 1B; however, the semiconductor device described in this embodiment mode is not limited to this structure and the second conductive films 114 may be provided so as to overlap with at least part of the semiconductor films 106.

Figure 2A:
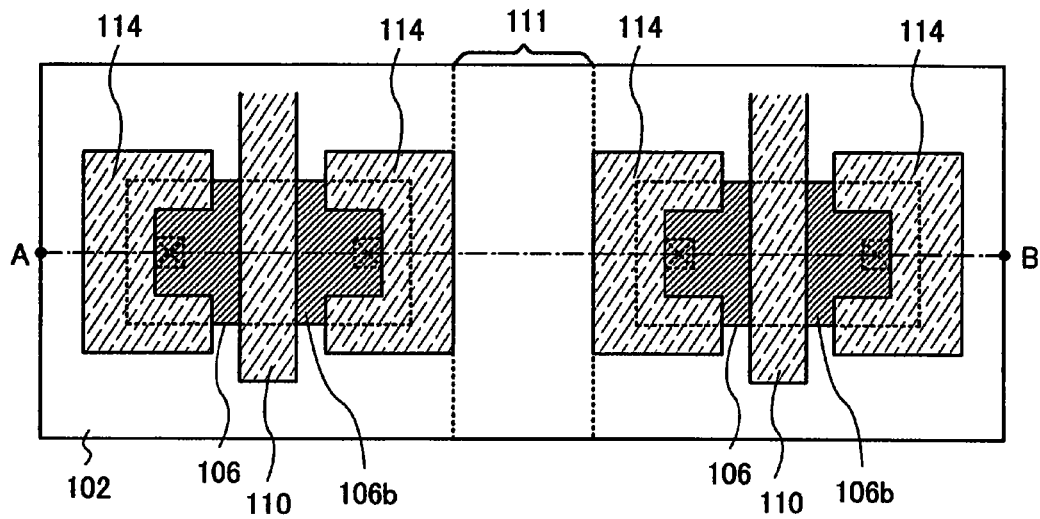
FIGS. 2A to 2C are views showing examples of a semiconductor device of the present invention.
Figure 2B:
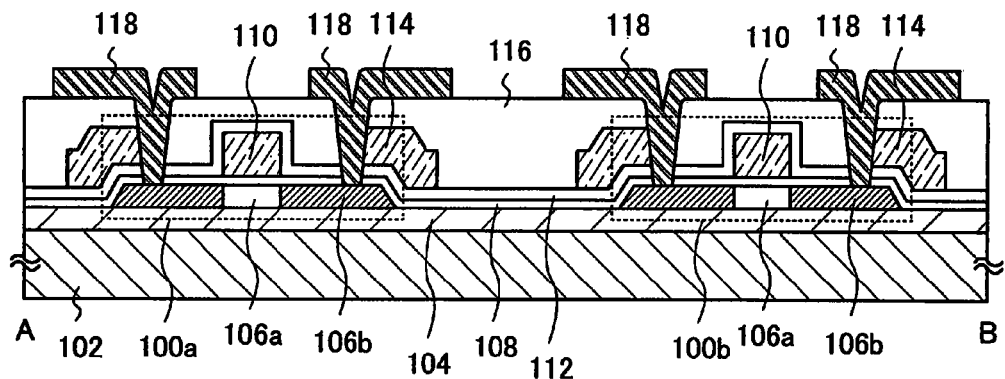
Figure 2C:
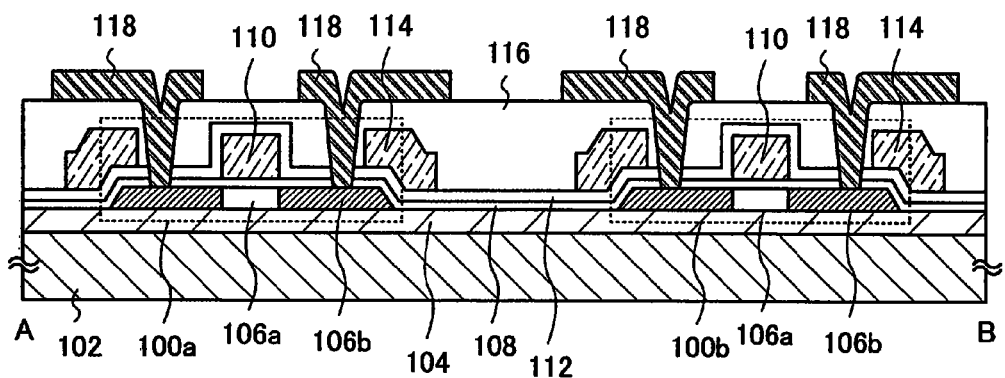

For example, a structure may be employed in which the openings are not formed in the second conductive films 114. In that case, the second conductive films 114 having square U shapes are provided so as to overlap with the end portions of the semiconductor films 106 (see FIGS. 2A to 2C); therefore, an area where the semiconductor film 106 and the second conductive film 114 overlap with each other can be increased even in the case where the openings are not formed in the second conductive films 114. Accordingly, even when the semiconductor device is stressed, the semiconductor films 106 can be protected effectively. In addition, as shown in FIGS. 2A to 2C, in the case where the openings are not provided in the second conductive films 114, it is not necessary that the second conductive films 114 be removed, so that etching can be performed easily. Note that FIG. 2A shows a top plan view and FIG. 2B or 2C shows a cross-sectional view taken along a line A-B in FIG. 2A.

In addition, in the case of employing a structure in which the openings are not formed in the second conductive films 114, the second conductive films 114 and the third conductive films 118 may be provided so as to be in contact with each other (see FIG. 2B) or so as not to be in contact with each other (see FIG. 2C).

Figure 3A:
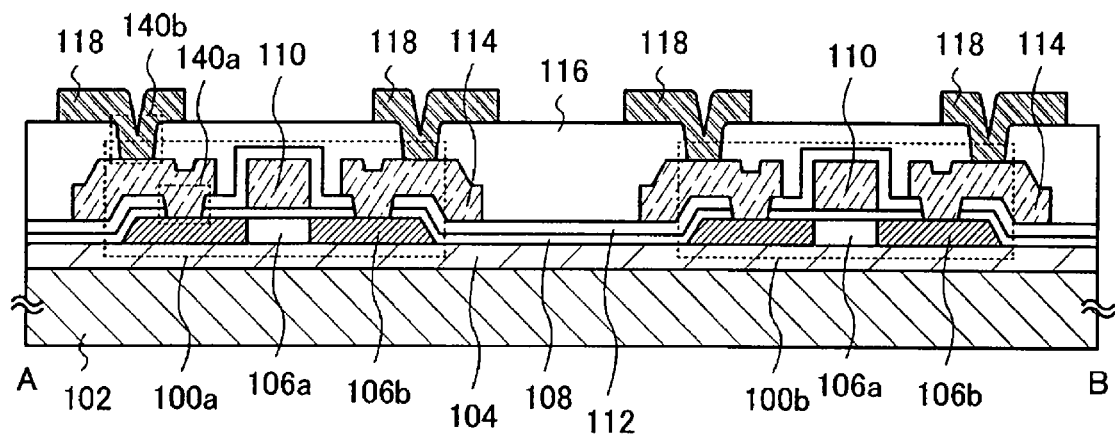
FIGS. 3A and 3B are views each showing an example of a semiconductor device of the present invention.

Alternatively, the second conductive films 114 may be provided so as to be electrically connected to the impurity regions 106b of the semiconductor films 106 (see FIG. 3A). In that case, the impurity regions 106b of the semiconductor films 106 and the second conductive films 114 are electrically connected through the openings 140a formed in the gate insulating film 108 and the insulating film 112. The second conductive films 114 and the third conductive films 118 are provided so as to be electrically connected to each other through the openings 140b.

By providing a structure as shown in FIG. 3A, it becomes unnecessary to form the openings in the second conductive films 114, and a region (area) where the semiconductor film 106 and the second conductive film 114 overlap with each other can be increased. Therefore, even in the case where the semiconductor device is stressed by, for example, being bent, it becomes possible to relieve stress caused in the semiconductor films 106 and thereby reduce damages and breakages of the semiconductor films 106.

Figure 3B:
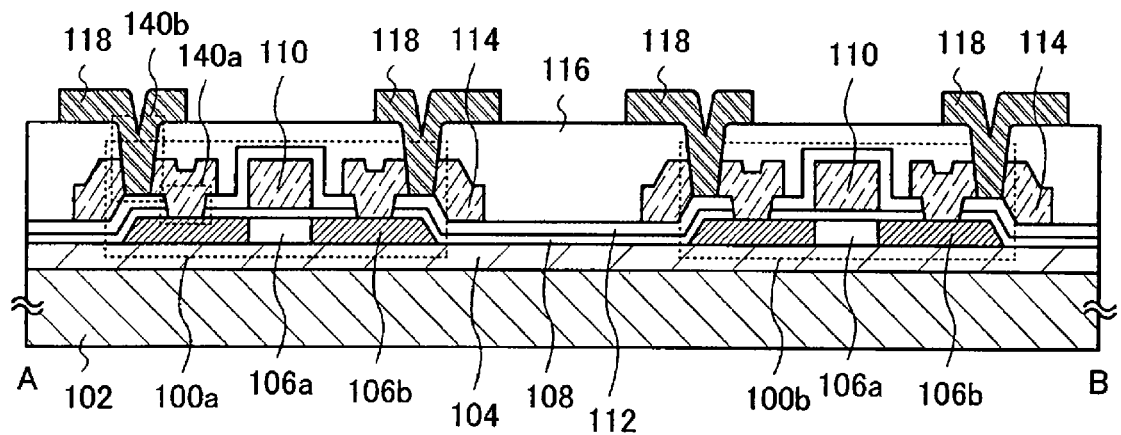

Note that a structure may be employed in which the openings 140b are formed in the second conductive films 114 to increase an area where the second conductive film 114 and the third conductive film 118 are in contact with each other, in order to reduce resistance of the second conductive films 114 and the third conductive films 118 (see FIG. 3B).

Thus, by employing the structures shown in FIGS. 1A to 3B, it is possible to efficiently reduce damages of the semiconductor films 106 in the manufacturing process of the semiconductor device or utilization after completion thereof and thereby improve the yield and reliability of the semiconductor device.

Note that in this embodiment mode, description is made using the thin film transistor as an example; however, an organic transistor may be provided instead of the thin film transistor.

In addition, in the aforementioned structure, the example is described in which the conductive films (the second conductive films 114 in FIGS. 1A and 1B) are provided as the protective films of the semiconductor films 106 (and further the thin film transistors 100a and 100b). Alternatively, a structure may be employed in which semiconductor films are provided as protective films instead of the conductive films.

In the case of using a conductive film as a protective film, the conductive film is formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above elements as its main component. In the case of using a semiconductor film, silicon (Si), germanium (Ge), or the like can be used. Alternatively, silicide containing a metal and a semiconductor may be used as a protective film.

The structure of a semiconductor device, which is described in this embodiment mode, can be combined with a structure of a semiconductor device, which is described in any other embodiment mode.

Embodiment Mode 2

In this embodiment mode, an example of a method for manufacturing the semiconductor device described in Embodiment Mode 1 is described with reference to drawings. Note that in this embodiment mode, the process is described in which after an element such as a thin film transistor is formed over a supporting substrate, the element is released from the supporting substrate to be transferred to another substrate.

Figure 4A:
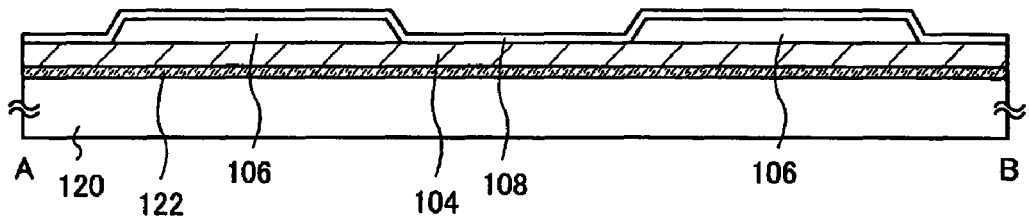
FIGS. 4A to 4E are views showing an example of a method for manufacturing a semiconductor device of the present invention.

First, a release layer 122 is formed over one surface of a substrate 120. Subsequently, an insulating film 104 that functions as a base and an amorphous semiconductor film (for example, a film containing amorphous silicon) are formed (see FIG. 4A). Note that the release layer 122, the insulating film 104, and the amorphous semiconductor film can be sequentially formed.

As the substrate 120, a glass substrate, a quartz substrate, a metal substrate, a stainless steel substrate, or the like can be used. In the case of using such a substrate, the area and the shape thereof are not particularly limited; therefore, by using, for example, a rectangular substrate with one side of at least 1 meter, the productivity can be extremely increased. This merit is greatly advantageous as compared to the case of using a circular silicon substrate. In addition, the release layer 122 is formed over an entire surface of the substrate 120 in this process; however, the release layer 122 may be selectively provided by a photolithography method after the release layer is formed over an entire surface of the substrate 120 as necessary. In addition, the release layer 122 is formed so as to be in contact with the substrate 120; however, an insulating film may be formed as a base to be in contact with the substrate 120 as necessary and the release layer 122 may be formed so as to be in contact with the insulating film.

As the release layer 122, a metal film, a stacked layer structure of a metal film and a metal oxide film, or the like can be used. The metal film is formed to have a single-layer structure or a stacked-layer structure of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material including any of the above elements as its main component. The metal film can be formed by a sputtering method, various CVD methods such as a plasma CVD method, or the like. As the stacked layer structure of a metal film and a metal oxide film, after the above metal film is formed, an oxide or oxynitride of the metal film can be formed on the surface of the metal film by performing plasma treatment in an oxygen atmosphere or an $N_2O$ atmosphere, or heat treatment in an oxygen atmosphere or an $N_2O$ atmosphere. For example, in the case where a tungsten film is provided by a sputtering method, a CVD method, or the like as the metal film, a metal oxide film of tungsten oxide can be formed on the surface of the tungsten film by performing plasma treatment to the tungsten film.

The insulating film 104 is formed to have a single-layer structure or a stacked-layer structure of a film containing oxide of silicon or nitride of silicon by a sputtering method, a plasma CVD method, or the like. In the case where the insulating film to be a base has a two-layer structure, a silicon nitride oxide film may be formed for a first layer, and a silicon oxynitride film may be formed for a second layer, for example. In the case where the insulating film to be a base has a three-layer structure, a silicon oxide film, a silicon nitride oxide film, and a silicon oxynitride film may be formed for a first layer, a second layer, and a third layer, respectively. Alternatively, a silicon oxynitride film, a silicon nitride oxide film, and a silicon oxynitride film may be formed for a first layer, a second layer, and a third layer, respectively. The insulating film to be a base functions as a blocking film for preventing impurities from entering from the substrate 120.

The amorphous semiconductor film is formed to a thickness of 25 to 200 nm (preferably, 30 to 150 nm) by a sputtering method, an LPCVD method, a plasma CVD method, or the like.

Next, the amorphous semiconductor film is crystallized by irradiation with laser light. Note that the amorphous semiconductor film may be crystallized by a method in which irradiation with laser light is combined with a thermal crystallization method using an RTA or an annealing furnace, or a thermal crystallization method using a metal element for promoting crystallization, or the like. After that, the obtained crystalline semiconductor film is etched so as to have a desired shape, thereby forming a crystalline semiconductor film 106. Then, a gate insulating film 108 is formed so as to cover the crystalline semiconductor film 106 (see FIG. 4A).

An example of a manufacturing step of the crystalline semiconductor film 106 is briefly described below. First, an amorphous semiconductor film with a thickness of 50 to 60 nm is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed to the amorphous semiconductor film, thereby forming a crystalline semiconductor film. After that, the crystalline semiconductor film is irradiated with laser light, and a photolithography method is used, so that the crystalline semiconductor film 106 is formed. Note that without being subjected to the thermal crystallization which uses the metal element for promoting crystallization, the amorphous semiconductor film may be crystallized only by irradiation with laser light.

The gate insulating film 108 is formed to have a single-layer structure or a stacked-layer structure of a film containing oxide of silicon or nitride of silicon by a CVD method, a sputtering method, or the like. Specifically, a film containing silicon oxide, a film containing silicon oxynitride, or a film containing silicon nitride oxide is formed to have a single-layer structure or a stacked-layer structure.

Alternatively, the gate insulating film 108 may be formed by performing plasma treatment to the semiconductor film 106 to oxidize or nitride the surface thereof. For example, the gate insulating film 108 is formed by plasma treatment introducing a mixed gas of a rare gas such as He, Ar, Kr, or Xe and oxygen, nitrogen oxide ($NO_2$), ammonia, nitrogen, hydrogen, or the like. When excitation of the plasma in this case is performed by introduction of a microwave, plasma with a low electron temperature and high density can be generated. By an oxygen radical (there is the case where an OH radical is included) or a nitrogen radical (there is the case where an NH radical is included) generated by this high-density plasma, the surfaces of the semiconductor films can be oxidized or nitrided.

By treatment using such high-density plasma, an insulating film with a thickness of 1 to 20 nm, typically 5 to 10 nm, is formed over the semiconductor film. Since the reaction of this case is a solid-phase reaction, interface state density between the insulating film and the semiconductor film can be extremely low. Since such high-density plasma treatment oxidizes (or nitrides) a semiconductor film (crystalline silicon, or polycrystalline silicon) directly, unevenness of a thickness of the insulating film to be formed can be extremely small, ideally. In addition, oxidation is not strengthened even in a crystal grain boundary of crystalline silicon, which makes a very preferable condition. That is, by a solid-phase oxidation of the surface of the semiconductor film by the high-density plasma treatment shown here, an insulating film with good uniformity and low interface state density can be formed without abnormal oxidation reaction in a crystal grain boundary.

As the gate insulating film 108, an insulating film formed by the high-density plasma treatment may be used by itself, or an insulating film of silicon oxide, silicon oxynitride, silicon nitride, or the like may be formed thereover by a CVD method using plasma or thermal reaction, so as to make stacked layers. In any case, a transistor including an insulating film formed by high-density plasma, in a part of the gate insulating film or in the whole gate insulating film, can reduce variation in the characteristics.

Furthermore, a semiconductor film is irradiated with a continuous wave laser or a laser beam oscillated at a frequency of at least 10 MHz and is scanned in one direction for crystallization, so that the semiconductor film 106 which has a characteristic that the crystal grows in the scanning direction of the beam is obtained. When a transistor is provided so that the scanning direction is aligned with the channel length direction (a direction in which carriers flow when a channel formation region is formed) and the above gate insulating layer is used, a thin film transistor (TFT) with less characteristic variation and high field effect mobility can be obtained.

Next, a conductive film for forming a gate electrode is formed over the gate insulating film 108. Here, a conductive film 124 and a conductive film 126 are sequentially stacked (see FIG. 4B). The conductive film 124 is formed to a thickness of 20 to 100 nm by a plasma CVD method or a sputtering method, and the conductive film 126 is formed to a thickness of 100 to 400 nm by a plasma CVD method or a sputtering method. The conductive film 124 and the conductive film 126 are formed using an element selected from tantalum (Ta), tungsten (W), titanium (Ti), molybdenum (Mo), aluminum (Al), copper (Cu), chromium (Cr), niobium (Nb), and the like, an alloy material or a compound material containing any of the above elements as its main component, or an alloy material or a compound material containing any of the above elements and a silicon (Si) element. Alternatively, they are formed using a semiconductor material (for example, silicon (Si)) typified by polycrystalline silicon doped with an impurity element such as phosphorus. As examples of a combination of the conductive film 124 and the conductive film 126, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the conductive film 124 and the conductive film 126 are formed. In addition, in a case of a three-layer structure instead of a two-layer structure, a stacked layer structure of a molybdenum film, an aluminum film, and a molybdenum film is preferably employed.

Figure 4B:
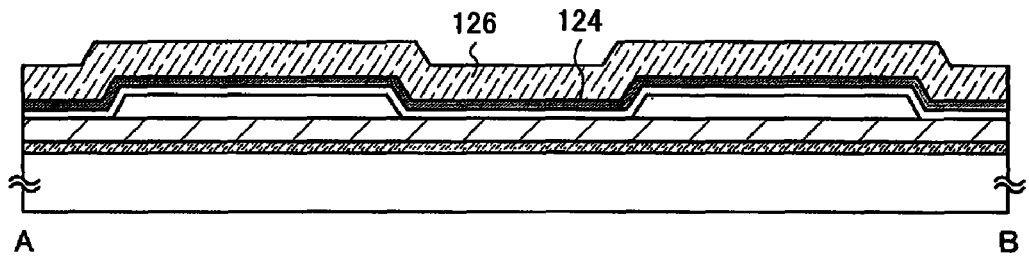
Figure 4C:
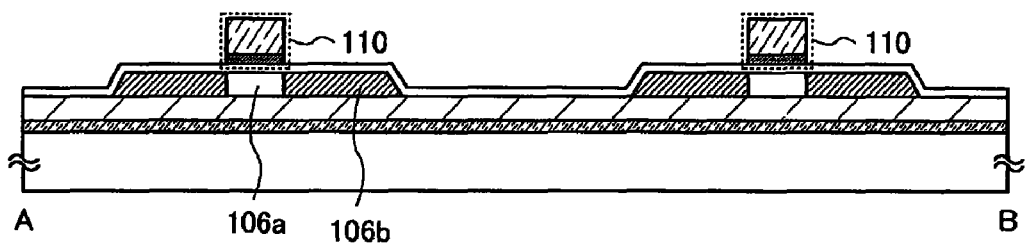

Next, after a resist mask is formed by a photolithography method and the conductive film 124 and the conductive film 126 are selectively etched, thereby the first conductive films 110 are formed, impurity elements are introduced into the semiconductor films 106 by using the first conductive films 110 as masks to form the channel formation regions 106a and the impurity regions 106b (see FIG. 4C). The first conductive films 110 function as gate electrodes (including gate wirings) in the thin film transistor, and the impurity regions 106b function as source and drain regions in the thin film transistor.

Further, as an impurity element to be introduced, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used for the impurity element and an n-channel thin film transistor is formed.

Figure 4D:
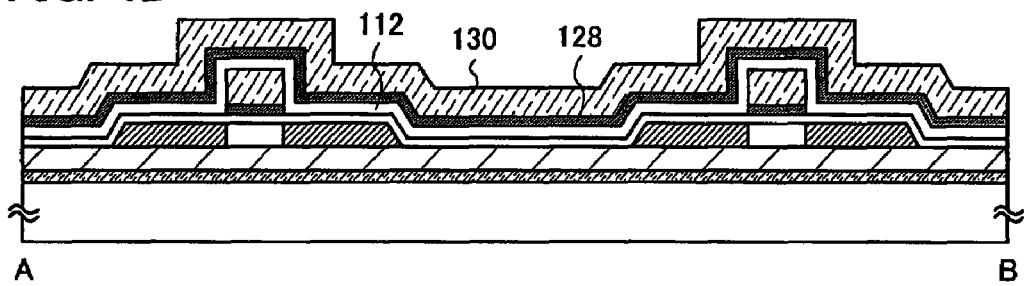

After the insulating film 112 is formed so as to cover the first conductive film 110 and the gate insulating film 108, a conductive film 128 and a conductive film 130 are sequentially stacked over the insulating film 112 (see FIG. 4D).

The conductive film 128 is formed to a thickness of 20 to 100 nm by a plasma CVD method or a sputtering method, and the conductive film 130 is formed to a thickness of 100 to 400 nm by a plasma CVD method or a sputtering method. The conductive film 128 and the conductive film 130 are formed using an element selected from tantalum (Ta), tungsten (W), titanium (Ti), molybdenum (Mo), aluminum (Al), copper (Cu), chromium (Cr), niobium (Nb), and the like, an alloy material or a compound material containing any of the above elements as its main component, or an alloy material or a compound material containing any of the above elements and a silicon (Si) element. Alternatively, they are formed using a semiconductor material (for example, silicon (Si)) typified by polycrystalline silicon doped with an impurity element such as phosphorus. As examples of a combination of the conductive film 128 and the conductive film 130, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the conductive film 128 and the conductive film 130 are formed. In addition, in a case of a three-layer structure instead of a two-layer structure, a stacked layer structure of a molybdenum film, an aluminum film, and a molybdenum film is preferably adopted. Here, the case where the conductive film 128 and the conductive film 130 are formed of the same materials as the conductive film 124 and the conductive film 126, respectively, is shown; however, the present invention is not limited to this.

The insulating film 112 can be formed to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, and a silicon nitride oxide ($SiN_xO_y$) (x>y) film; a film containing carbon such as DLC (Diamond Like Carbon); or a film made of an organic material such as epoxy, polyimide, polyamide, polyvinylphenol, benzocyclobutene, or acrylic, or a siloxane material such as a siloxane resin. Note that the siloxane material corresponds to a material including a Si—O—Si bond. Siloxane is composed of a skeleton formed by the bond of silicon (Si) and oxygen (O), in which an organic group containing at least hydrogen (such as an alkyl group or aromatic hydrocarbon) is contained as a substituent. Alternatively, a fluoro group may be used as the substituent. Further alternatively, a fluoro group and an organic group containing at least hydrogen may be used as the substituent.

Figure 4E:
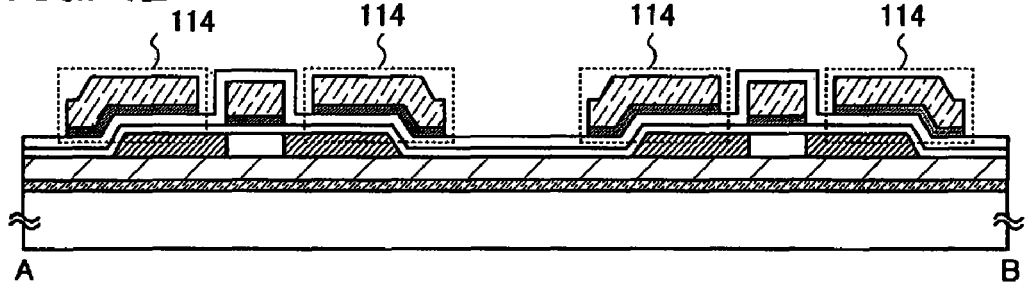

A resist mask is formed by a photolithography method and the conductive film 128 and the conductive film 130 are selectively etched, thereby the second conductive films 114 are formed (see FIG. 4E). The second conductive films 114 function as protective films of the semiconductor films 106 and further the thin film transistor and are formed so as to cover end portions of the impurity regions 106b of the semiconductor films 106. Note that in this embodiment mode, the case is described in which the first conductive film 110 and the second conductive film 114 are formed of the same material; however, they may be formed of different materials. In addition, the second conductive films 114 having island shapes can be formed so as to cover the end portions of the impurity regions 106b. Note that upon formation of the second conductive films 114 functioning as the protective films of the semiconductor films 106 by selectively etching the conductive film 128 and the conductive film 130, a conductive film pattern functioning as a wiring may be formed. In that case, the conductive film functioning as a wiring is provided over the same layer as the second conductive films 114 (here, the insulating film 112).

Figure 5A:
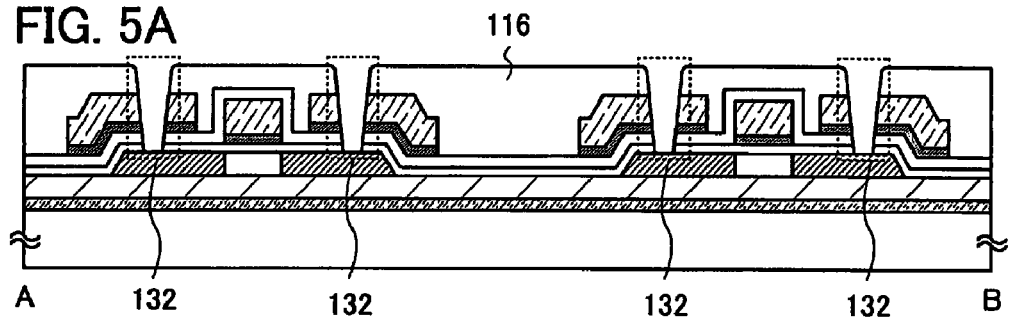
FIGS. 5A to 5D are views showing an example of a method for manufacturing a semiconductor device of the present invention.

After the insulating film 116 is formed so as to cover the insulating film 112 and the second conductive films 114, openings 132 which reach the impurity regions 106b of the semiconductor films 106 are formed to partially expose surfaces of the semiconductor films 106 (see FIG. 5A). Here, the gate insulating film 108, the insulating film 112, the second conductive films 114, and the insulating film 116 are partially etched to form the openings 132.

The insulating film 116 can be formed to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film; a film containing carbon such as DLC (Diamond Like Carbon); or a film made of an organic material such as epoxy, polyimide, polyamide, polyvinylphenol, benzocyclobutene, or acrylic; and a siloxane material such as a siloxane resin.

Figure 5B:
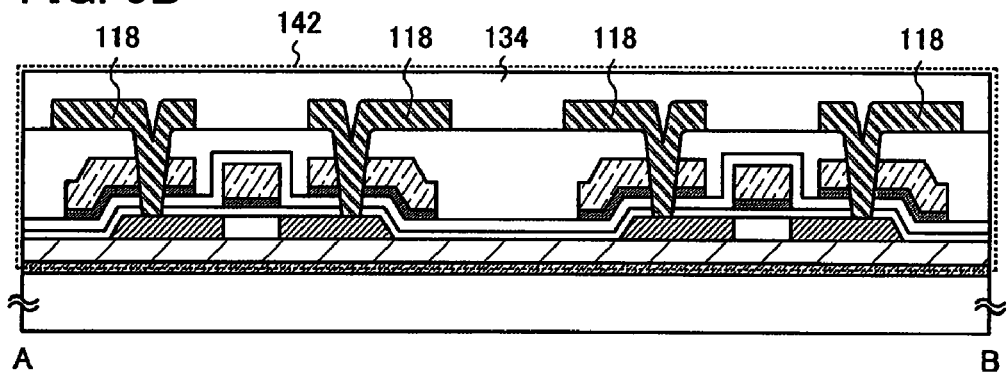

Next, the third conductive films 118 are selectively formed so as to fill the openings 132, and an insulating film 134 is formed so as to cover the third conductive films 118 (see FIG. 5B).

The conductive film 118 is formed to have a single layer or stacked layers using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component, by a CVD method, a sputtering method, or the like. An alloy material containing aluminum as its main component corresponds to a material which contains aluminum as its main component and also contains nickel, or an alloy material which contains aluminum as its main component and also contains nickel and one or both of carbon and silicon, for example. The conductive film 118 preferably employs, for example, a stacked layer structure of a barrier film, an aluminum-silicon (Al—Si) film, and a barrier film, or a stacked layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 118. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film can be reduced so that preferable contact with the crystalline semiconductor film can be obtained. Note that the barrier film may be formed using the same material as the first conductive film 110 or the second conductive film 114.

The insulating film 134 can be formed to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, and a silicon nitride oxide ($SiN_xO_y$) (x>y) film; a film containing carbon such as DLC (Diamond Like Carbon); or a film made of an organic material such as epoxy, polyimide, polyamide, polyvinylphenol, benzocyclobutene, or acrylic; and a siloxane material such as a siloxane resin.

Next, an element formation layer 142 including the thin film transistors 100a and 100b and the like is released from the substrate 120. Here, openings are formed in the element formation layer 142 by laser light (such as UV light) irradiation, and then, one surface (a surface where the insulating film 134 is exposed) of the element formation layer 142 is attached to a first sheet material 136 and the element formation layer 142 is released from the substrate 120 by using physical force (see FIG. 5C).

Alternatively, an etchant may be introduced into the openings before the element formation layer 142 is released from the substrate 120; thereby selectively removing the release layer 122. As the etchant, gas or a liquid containing halogen fluoride or an interhalogen compound is used. For example, chlorine trifluoride ($ClF_3$) can be used as gas containing halogen fluoride.

In general, when the element formation layer 142 is released from the substrate 120, the thin film transistors 100a and 100b are stressed, and thus the semiconductor films 106 or the like might be damaged by the thin film transistors 100a and 100b. However, by provision of the second conductive films 114 functioning as protective films, even in the case where the element formation layer 142 is stressed by, for example, being bent, the stress is concentrated in the region 111 where an element such as a transistor is not formed and thereby damages and breakages of the thin film transistors 100a and 100b can be reduced. In particular, in the case where an element such as a transistor is formed over a supporting substrate and then transferred to another substrate, it is highly efficient to provide the second conductive film 114.

Note that releasing is performed with a surface to be released getting wet by water or a solution such as ozone water, thereby preventing an element such as the thin film transistor 100a or 100b from being damaged by static electricity or the like.

Figure 5C:
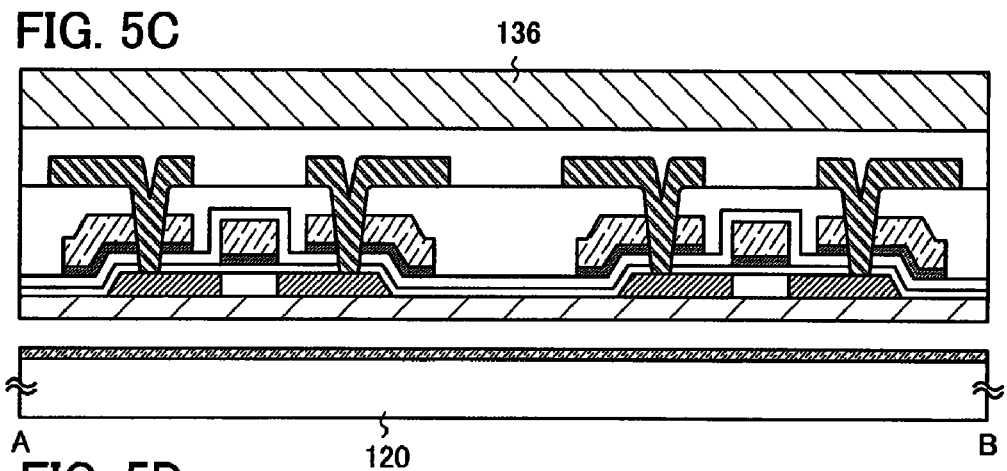
Figure 5D:
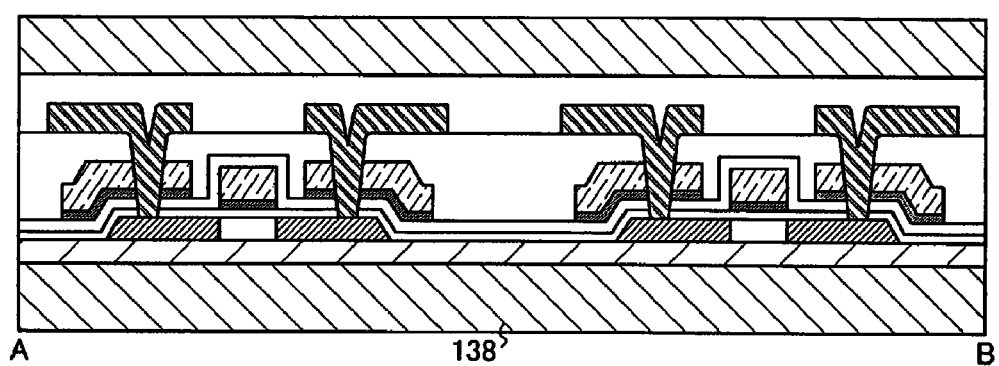

Next, a second sheet material 138 is provided on the other surface (the surface released from the substrate 120) of the element formation layer 142, and then one or both of heat treatment and pressure treatment are performed to attach the second sheet material 138 to the element formation layer 142 (see FIG. 5D). As the first sheet material 136 and the second sheet material 138, a hot-melt film, a plastic substrate over which an adhesive layer is formed, or the like can be used.

As the first sheet material 136 and the second sheet material 138, a film on which an antistatic treatment for preventing static electricity or the like is performed (hereinafter referred to as an antistatic film) may be used. As the antistatic film, a film with an antistatic material dispersed in a resin, a film with an antistatic material attached thereon, and the like can be given as examples. The film provided with an antistatic material may be a film with an antistatic material provided over one of its surfaces, or a film with an antistatic material provided over each of its surfaces. As for the film with an antistatic material provided over one of its surfaces, the film may be attached to the layer so that the antistatic material is placed on the inner side of the film or the outer side of the film. Note that the antistatic material may be provided over the entire surface of the film, or over a part of the film. As the antistatic material here, a metal, indium tin oxide (ITO), or a surfactant such as an amphoteric surfactant, a cationic surfactant, or a nonionic surfactant can be used. Alternatively, as the antistatic material, a resin material containing cross-linked copolymer having a carboxyl group and a quaternary ammonium base on its side chain, or the like can be used. By attaching, mixing, or applying such a material to a film, an antistatic film can be formed. The sealing is performed using the antistatic film, and thus a semiconductor element can be prevented from being adversely affected due to static electricity from outside when dealt with as a product.

Upon or after provision of the second sheet material 138, the first sheet material 136 may be released. By removing the first sheet material 136, a semiconductor device can be formed thinner. Note that, in that case, as the first sheet material 136, a thermal release tape of which adhesiveness is lowered by heat can be used, for example. In addition, a sheet material is referred to as a substrate in some cases, and the second sheet material 138 corresponds to the substrate 102 in FIGS. 1A and 1B.

Through the above process, a semiconductor device can be manufactured. Note that, in this embodiment mode, the process is described in which after a thin film transistor is formed over a supporting substrate, the element is released from the supporting substrate to be transferred to another substrate; however, the manufacturing method described in this embodiment mode is not limited to this. For example, the thin film transistors 100a and 100b may be directly provided over the substrate 102. In that case, it is only necessary that the substrate 102 be used instead of the substrate 120 and the release layer 122 be not provided in the above process. As the substrate 102, a metal substrate such as a glass substrate, a quartz substrate, or a stainless steel substrate, a plastic substrate, or the like may be used.

Note that the methods for manufacturing a semiconductor device, which are shown in FIGS. 4A to 5D, are the methods for manufacturing the semiconductor device of the above embodiment mode, which is shown in FIGS. 1A and 1B. The semiconductor devices shown in FIGS. 2A to 2C and FIGS. 3A and 3B can also be manufactured by the above manufacturing methods.

For example, in the case of manufacturing the semiconductor device shown in FIGS. 2A to 2C, the second conductive films 114 may be selectively etched except for a portion of the second conductive films 114 in which the openings 132 are formed later in FIG. 4E.

The case of manufacturing the semiconductor device shown in FIGS. 3A and 3B is described with reference to FIGS. 6A to 6E.

Figure 6A:
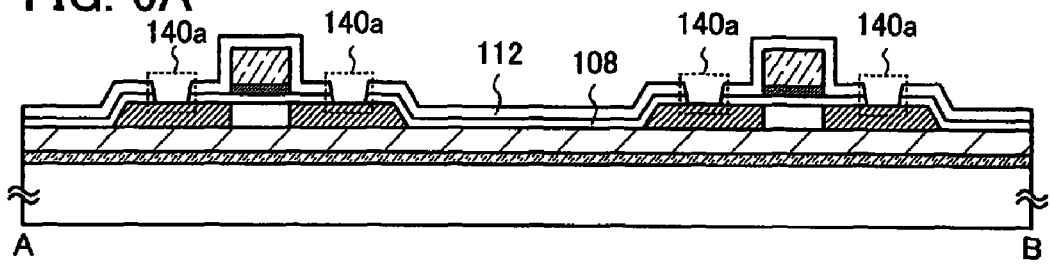
FIGS. 6A to 6E are views showing an example of a method for manufacturing a semiconductor device of the present invention.

First, a structure up to that shown in FIG. 4C is similarly formed, the insulating films 112 are formed so as to cover the gate insulating films 108 and the first conductive films 110, and then the gate insulating films 108 and the insulating films 112 are selectively removed to form the openings 140a (see FIG. 6A). In the openings 140a, at least part of the impurity regions 106b of the semiconductor films 106 is exposed.

Figure 6B:
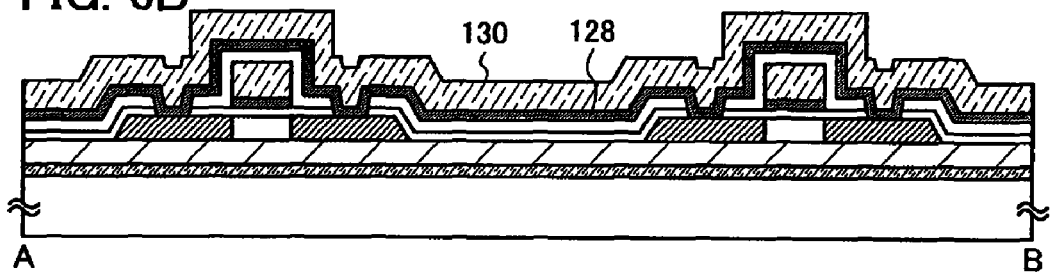

Next, the conductive film 128 and the conductive film 130 are sequentially formed over the insulating films 112 so as to be electrically connected to the impurity regions 106b of the semiconductor films 106 (see FIG. 6B). Here, the conductive film 128 and the conductive film 130 are formed in the openings 140a.

Figure 6C:
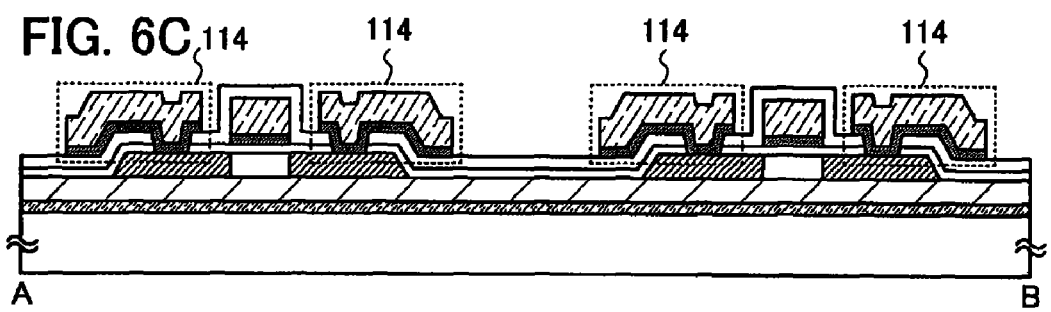

A resist mask is formed by a photolithography method and the conductive film 128 and the conductive film 130 are selectively etched, thereby the second conductive films 114 are formed (see FIG. 6C). Note that, here, the second conductive films 114 are electrically connected to the impurity regions 106b of the semiconductor films 106.

Figure 6D:
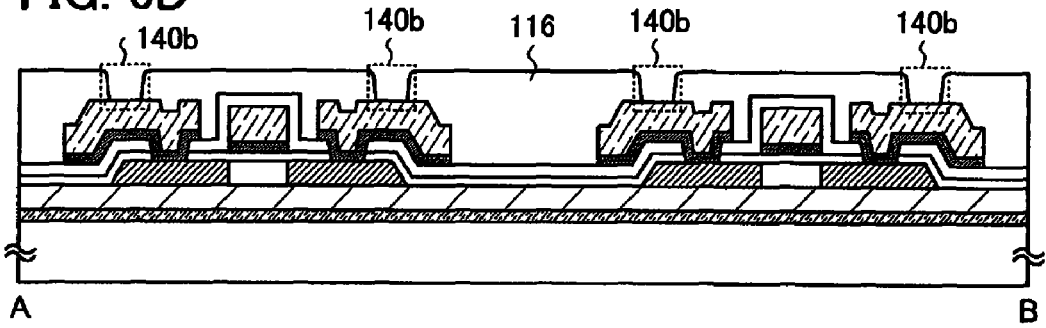

After the insulating film 116 is formed so as to cover the insulating film 112 and the second conductive films 114, openings 140b which reach the second conductive films 114 are formed to partially expose surfaces of the second conductive films 114 (see FIG. 6D). Here, the insulating film 116 is partially etched to form the openings 140b. Note that the openings 140b may be formed by partially etching the second conductive films 114.

Figure 6E:
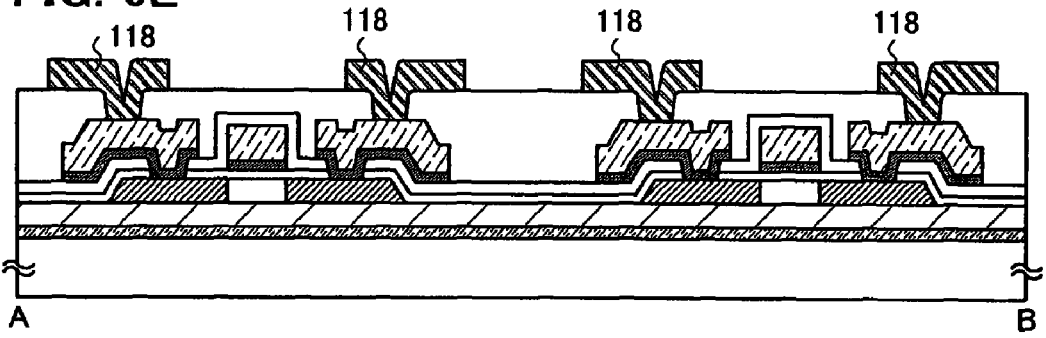

Next, the third conductive films 118 are selectively formed so as to fill the openings 140b (see FIG. 6E). Thereafter, by using the manufacturing method described in the above embodiment mode, a semiconductor device can be manufactured.

The method for manufacturing a semiconductor device, which is described in this embodiment mode, can be combined with that described in any other embodiment mode.

Embodiment Mode 3

In this embodiment mode, the case where, in a thin film transistor of the semiconductor device described in Embodiment Mode 1 or 2, an insulating film is formed to be in contact with a side surface of the first conductive film functioning as a gate electrode and an LDD region is formed below the insulating film is described with reference to drawings.

Figure 7A:
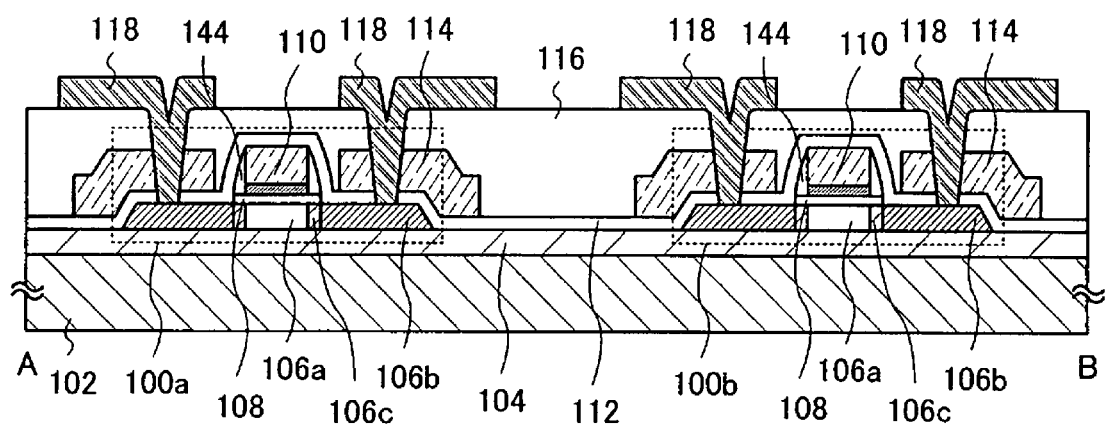
FIGS. 7A and 7B are views each showing an example of a semiconductor device of the present invention.
Figure 7B:
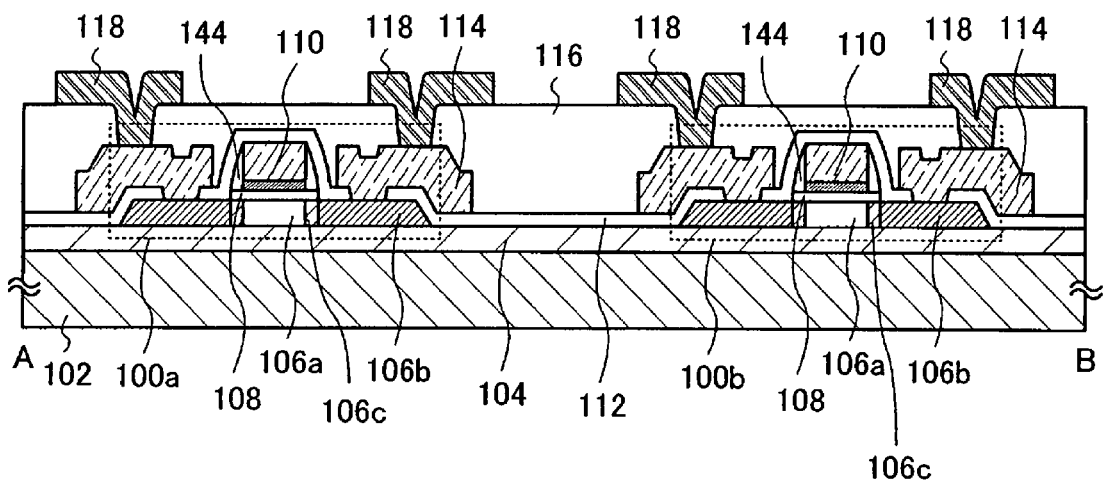

The semiconductor device described in this embodiment mode includes the thin film transistors 100a and 100b, and insulating films 144 are provided to be in contact with a side surface of the first conductive films 110 functioning as gate electrodes, which are included in the thin film transistors 100a and 100b (see FIGS. 7A and 7B). The insulating films 144 are also referred to as side walls, and a structure in which LDD regions are provided below the insulating films 144 can be employed. Note that FIG. 7A shows a structure in FIGS. 1A and 1B in which the insulating films 144 and the impurity regions 106c functioning as LDD regions are additionally provided, and FIG. 7B shows a structure in FIGS. 3A and 3B in which the insulating films 144 and the impurity regions 106c functioning as LDD regions are additionally provided.

Next, an example of a method for manufacturing the insulating films 144 is described with reference to FIGS. 8A to 8E.

First, a structure up to that of Embodiment Mode 2, which is shown in FIG. 4B, is similarly formed, a resist mask is formed by a photolithography method and the first conductive films 110 are formed by selectively etching the conductive film 124 and the conductive film 126. Then, a first impurity element is introduced into the semiconductor films 106 by using the first conductive films 110 as masks, so that the channel formation regions 106a and the impurity regions 146 are formed (see FIG. 8A). As the first impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, the case is described in which phosphorus (P) is used for the impurity element and an n-channel thin film transistor is formed.

Figure 8A:
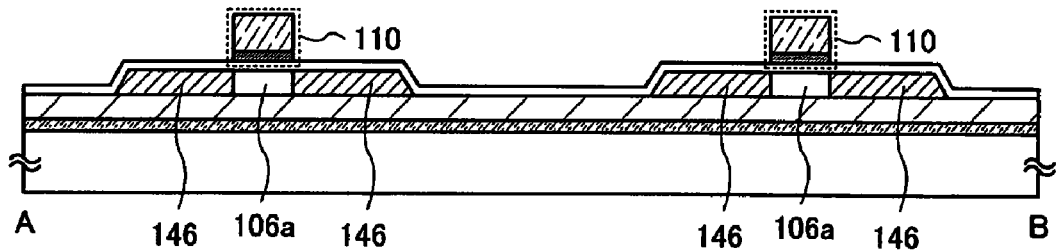
FIGS. 8A to 8E are views showing an example of a method for manufacturing a semiconductor device of the present invention.
Figure 8B:
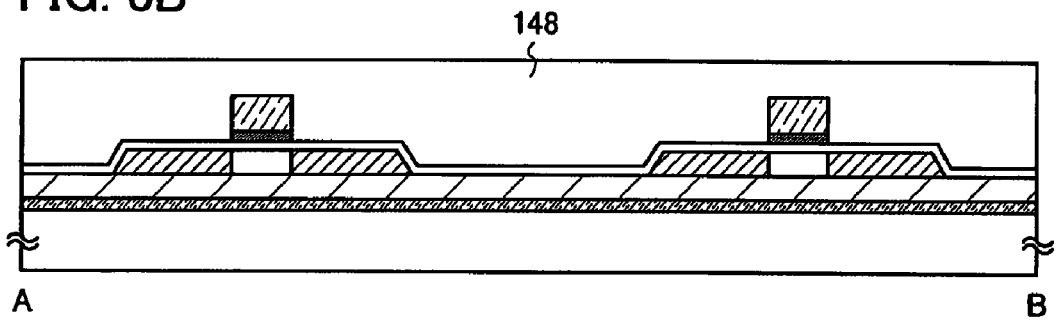
Figure 8C:
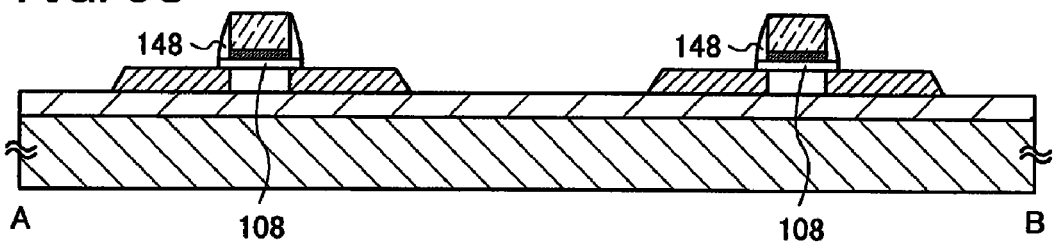

Next, insulating films 148 are formed so as to cover the first conductive film 110 and the gate insulating film 108 (see FIG. 8B). Each of the insulating films 148 is formed to have a single-layer structure or a stacked-layer structure of a film including an inorganic material such as silicon, an oxide of silicon, or a nitride of silicon, and a film including an organic material such as an organic resin, by a plasma CVD method, a sputtering method, or the like.

Next, the insulating films 148 are selectively etched by anisotropic etching which mainly etches in a perpendicular direction, so that the insulating films 148 (side walls) which are in contact with side surfaces of the first conductive films 110 are formed. Note that there is the case where upon formation of the insulating films 148, the gate insulating films 108 and the insulating film 104 are partially etched to be removed (see FIG. 8C). The gate insulating films 108 is partially removed, and thus a left portion of the gate insulating film 108 is below the first conductive film 110 and the insulating films 148.

Figure 8D:
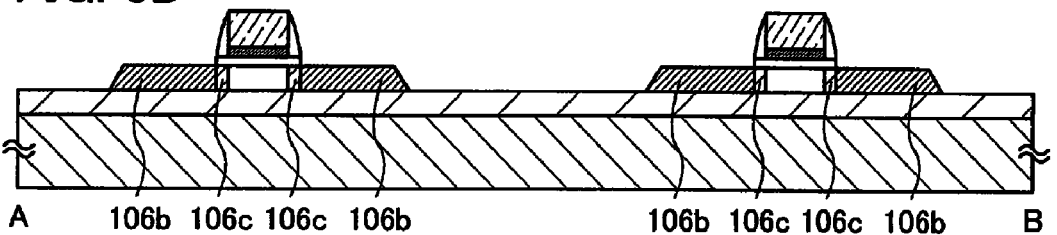

Next, a second impurity element is introduced into the semiconductor films 106 by using the first conductive films 110 and the insulating film 148 as masks, so that the impurity regions 106b functioning as source and drain regions and the impurity regions 106c functioning as LDD regions are formed (see FIG. 8D). As the second impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. In addition, the second impurity element is introduced at higher concentration than the first impurity element. Here, phosphorus (P) is used for the impurity element.

Figure 8E:
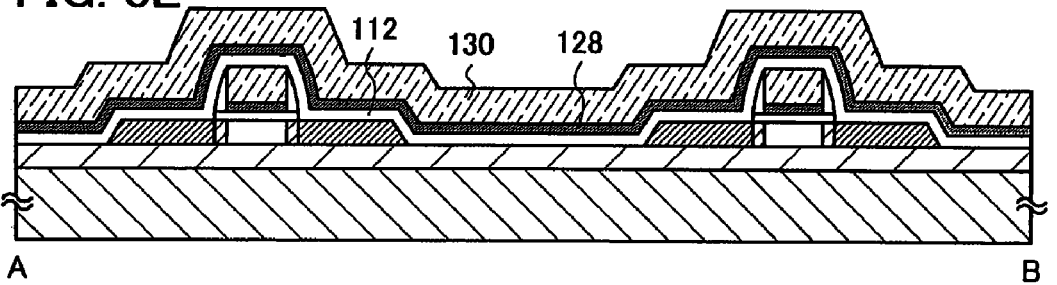

Next, the insulating film 112, the conductive film 128, and the conductive film 130 are sequentially formed so as to cover the semiconductor films 106, the first conductive film 110, and the insulating films 148 (see FIG. 8E). Thereafter, the semiconductor device shown in FIGS. 7A and 7B can be manufactured through the process described in Embodiment Mode 1, which is shown in FIGS. 4E to 6E.

The structure of a semiconductor device or the manufacturing method thereof, which is described in this embodiment mode, can be combined with that described in any other embodiment mode.

Embodiment Mode 4

In this embodiment mode, a semiconductor device which is different from that in any of the above embodiment modes is described with reference to drawings. Specifically, the case where a first conductive film which can function as a gate electrode and a second conductive film which can function as a protective film are formed of the same material at the same time is described.

The semiconductor device described in this embodiment mode is provided with the first conductive films 110 which can function as gate electrodes of the thin film transistors 100a and 100b and the second conductive films 114 which can function as protective films over a gate insulating film 108. The first conductive films 110 and the second conductive films 114 are formed of the same material. Further, in each of the semiconductor films 106, one of the impurity regions 106b functioning as source and drain regions and one of the impurity regions 106c functioning as LDD regions are provided separately from the other of the impurity regions 106b functioning as source and drain regions and the other of the impurity regions 106c functioning as LDD regions with the channel formation region 106a interposed therebetween. Note that the other portions can be provided similarly to those in the structure described in any of the above embodiment modes (see FIGS. 9A and 9B).

The second conductive films 114 are provided so as to overlap with at least part of the impurity regions 106b in the semiconductor films 106 with the gate insulating film 108 interposed therebetween and can function as the semiconductor films 106 and further the protective films of the thin film transistors 100a and 100b. In addition, here, the first conductive films 110 and the second conductive films 114 which function as gate electrodes can be manufactured at the same time in the manufacturing process of the semiconductor device. That is, the first conductive films 110 and the second conductive films 114 are formed of the same material over the same layer (over the gate insulating film 108, here).

Figure 9A:
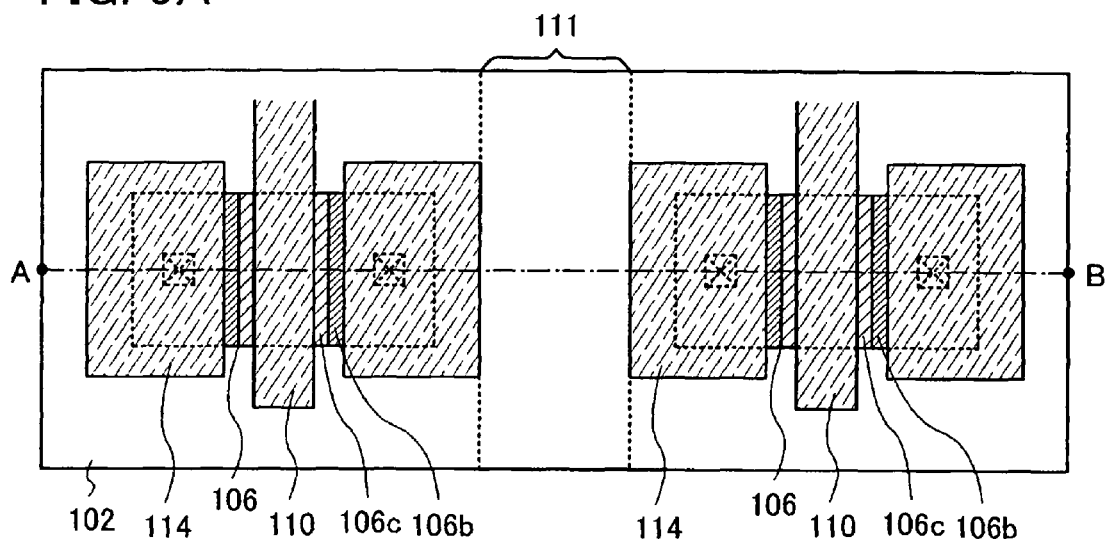
FIGS. 9A and 9B are views showing an example of a semiconductor device of the present invention.
Figure 9B:
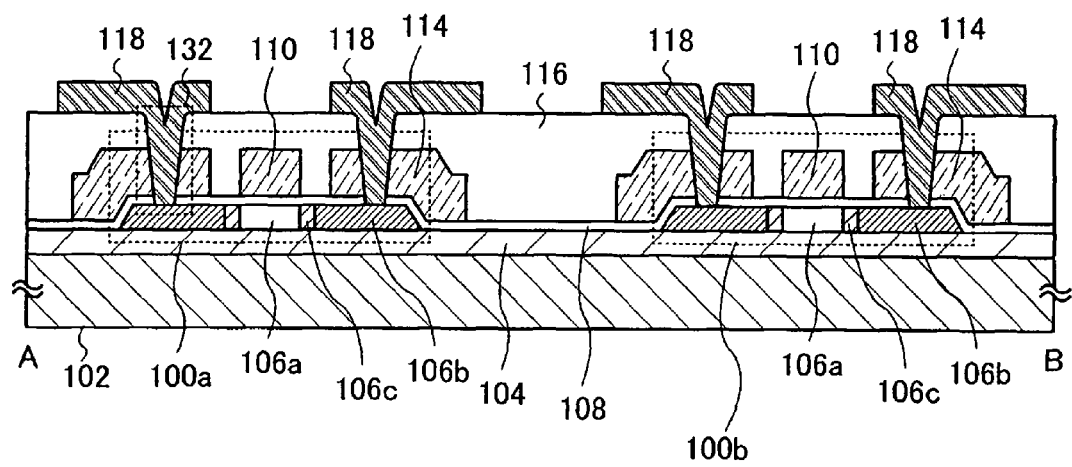

Further, in FIGS. 9A and 9B, the second conductive films 114 are provided so as to be in contact with the third conductive films 118 in openings 132. The openings 132 are formed in the second conductive films 114; therefore, a region where the semiconductor film 106 and the second conductive film 114 overlap with each other can be increased. Note that the openings 132 are each formed in the gate insulating film 108 and the insulating film 116 in order to electrically connect the impurity region 106b of the semiconductor film 106 and the third conductive film 118, and in FIGS. 9A and 9B, the openings are formed in the second conductive films 114 as well.

Thus, by provision of the second conductive films 114, the stress is concentrated in a region 111 (between the thin film transistors 100a and 100b) where an element such as a transistor is not formed (the semiconductor device is bent in the region 111) even in the case where the semiconductor device is stressed by, for example, being bent; therefore, damages and breakages of the thin film transistors 100a and 100b can be reduced.

The second conductive films 114 are preferably provided so as to cover the end portions of the semiconductor films 106 (for example, end portions of the impurity regions 106b). By providing the second conductive films 114 so as to cover the end portions of the semiconductor films 106, which is most easily damaged due to external physical stress such as bending, in the thin film transistors 100a and 100b, it becomes possible to efficiently reduce damages on the semiconductor films 106 in the manufacturing process of the semiconductor device or utilization after completion thereof and thereby improve the yield and reliability of the semiconductor device. In particular, by increasing an area where the semiconductor film 106 and the second conductive film 114 overlap with each other (for example, by forming the openings 132 in the second conductive films 114), it becomes possible to efficiently reduce damages on the semiconductor films 106 and thereby improve the yield and reliability of the semiconductor device.

Note that an example is shown in which the openings are formed in the second conductive films 114 as well in the semiconductor device shown in FIGS. 9A and 9B; however, the semiconductor device described in this embodiment mode is not limited to this structure and the second conductive films 114 may be provided so as to overlap with at least part of the semiconductor film 106.

Figure 10A:
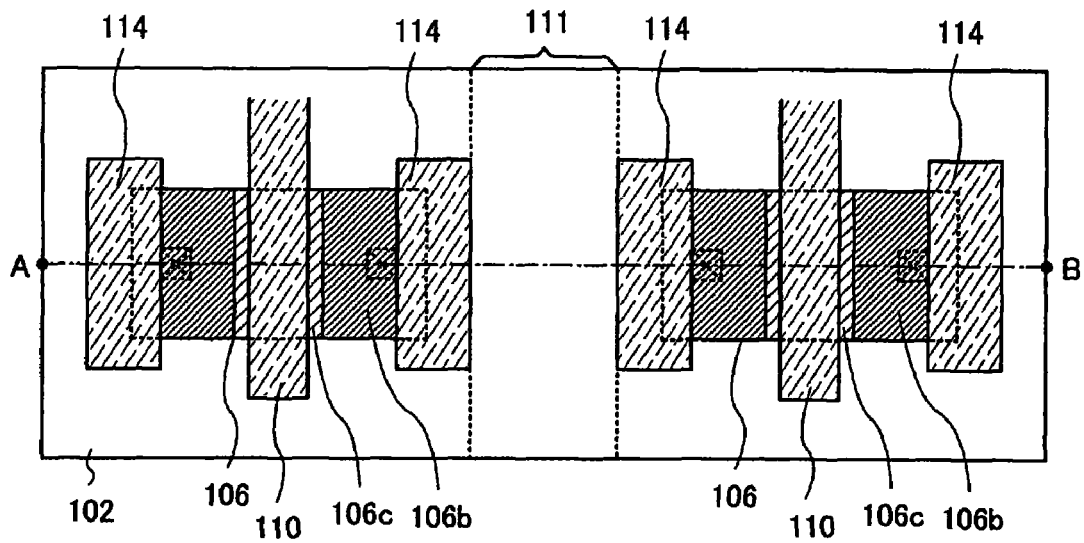
FIGS. 10A to 10C are views showing examples of a semiconductor device of the present invention.
Figure 10B:
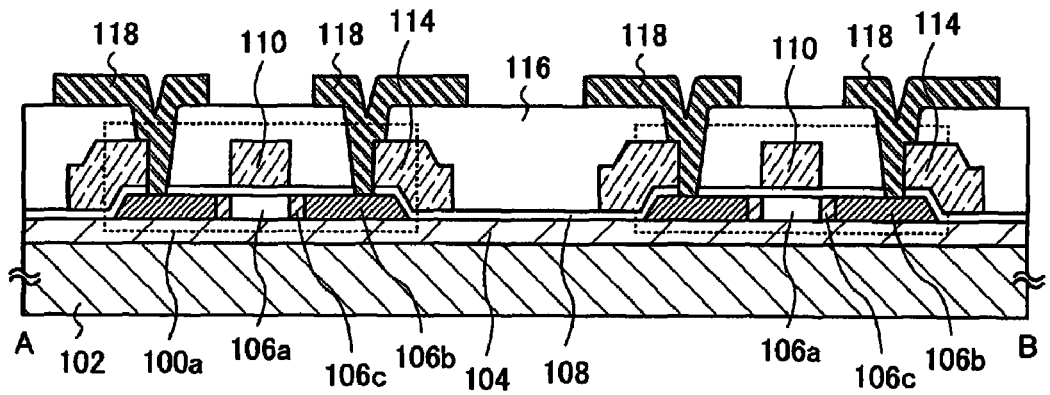
Figure 10C:
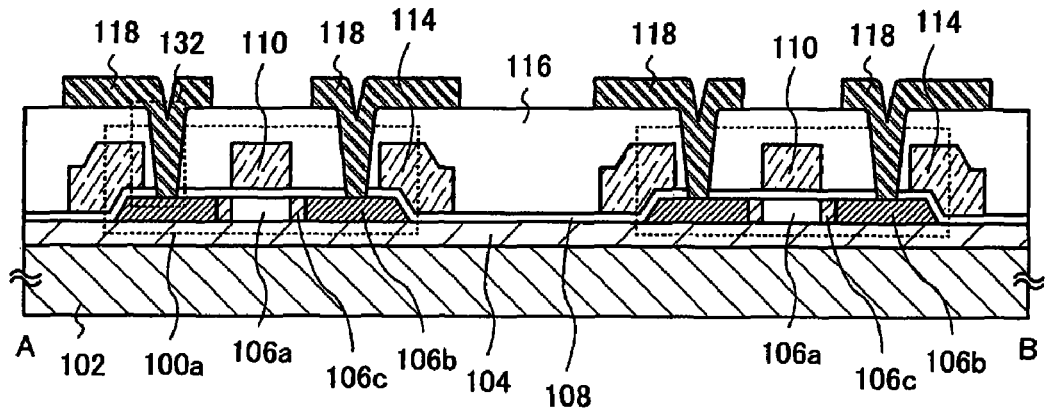

For example, a structure may be employed in which the openings are not formed in the second conductive films 114 (see FIGS. 10A to 10C). Note that, as shown in FIGS. 2A to 2C described above, the second conductive films 114 having square U shapes may be provided so as to cover the edge portions of the semiconductor films 106. It is needless to say that the second conductive films 114 may be provided in FIGS. 2A to 2C as shown in FIGS. 10A to 10C. Note that FIG. 10A shows a top plan view and FIG. 10B or 10C shows a cross-sectional view taken along a line A-B in FIG. 10A.

In addition, in the case of employing a structure in which the openings are not formed in the second conductive films 114, the second conductive films 114 and the third conductive films 118 can be provided so as to be in contact with each other. Note that, in that case, part of the third conductive films 118 may be provided on the second conductive films 114 (see FIG. 10B). Note that a structure may be provided similarly to that shown in FIG. 2B, which is described above, or the structure in FIG. 2B in which part of the third conductive films 118 are provided on the second conductive films 114 may be employed. Alternatively, the second conductive films 114 and the third conductive films 118 may be provided so as not to be in contact with each other (see FIG. 10C).

As shown in FIGS. 10A to 10C, in the case where the openings are not provided in the second conductive films 114, it is not necessary that the second conductive films 114 be removed when the openings are formed, so that etching can be performed easily.

Figure 11:
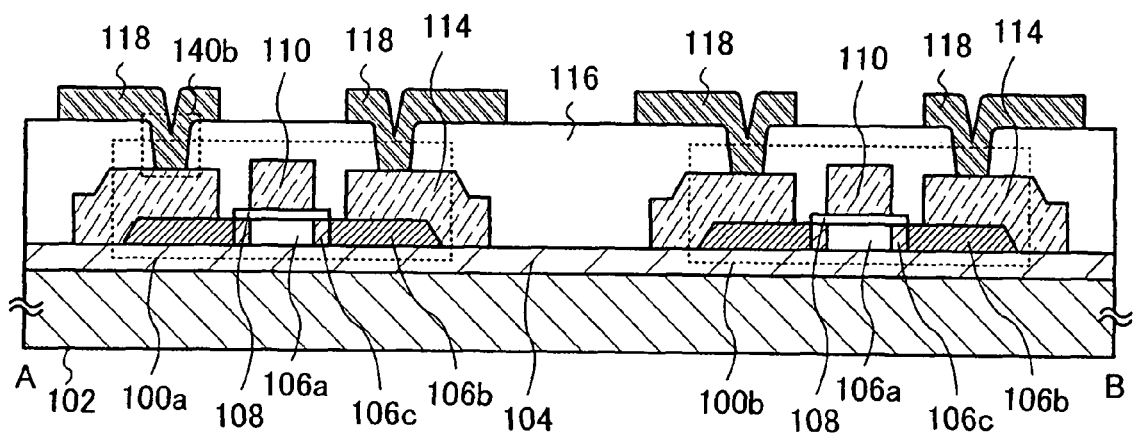
FIG. 11 is a view showing an example of a semiconductor device of the present invention.

Alternatively, the second conductive films 114 may be provided so as to be electrically connected to the impurity regions 106b of the semiconductor films 106 (see FIG. 11). In that case, the second conductive films 114 can be provided so as to be in contact with the semiconductor films 106. Here, an example is shown in which the second conductive films 114 are provided so as to cover the end portions of the semiconductor films 106 (the end portions of the impurity regions 106b). The second conductive films 114 and the third conductive films 118 are electrically connected to each other through the openings 140b.

Thus, by providing the second conductive films 114 to be in contact with the semiconductor films 106, it is possible to efficiently reduce damages on the semiconductor films 106 in the manufacturing process of the semiconductor device or utilization after completion thereof and thereby improve the yield and reliability of the semiconductor device. In addition, by removing the gate insulating film 108 to increase an area where the second conductive film 114 and the impurity region 106b of the semiconductor film 106 are in contact with each other, it becomes possible to reduce connection resistance.

Next, an example of a method for manufacturing the semiconductor device described above is described with reference to drawings. Note that an example is described here in which a thin film transistor is formed over a substrate; however, the process may be used in which after an element such as a thin film transistor is formed over a supporting substrate, the element is released from the supporting substrate to be transferred to another substrate as described in Embodiment Mode 2.

Figure 12A:
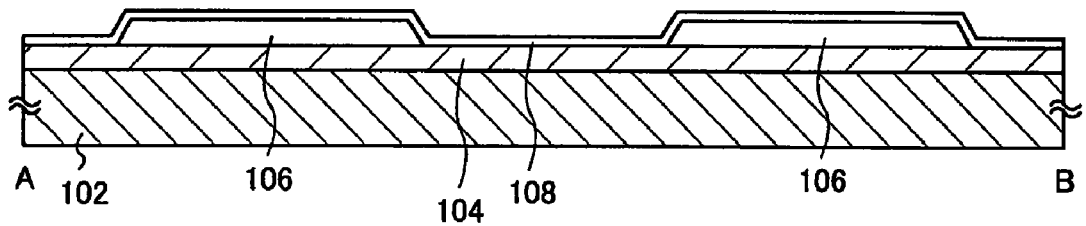
FIGS. 12A to 12E are views showing an example of a method for manufacturing a semiconductor device of the present invention.

After the semiconductor films 106 are formed over the substrate 102 with the insulating film 104 to be a base interposed therebetween, the gate insulating film 108 is formed so as cover the semiconductor films 106 (see FIG. 12A). Note that the materials and the manufacturing method which are described in Embodiment Mode 2 can be applied to the insulating film 104, the semiconductor films 106, and the gate insulating film 108.

Figure 12B:
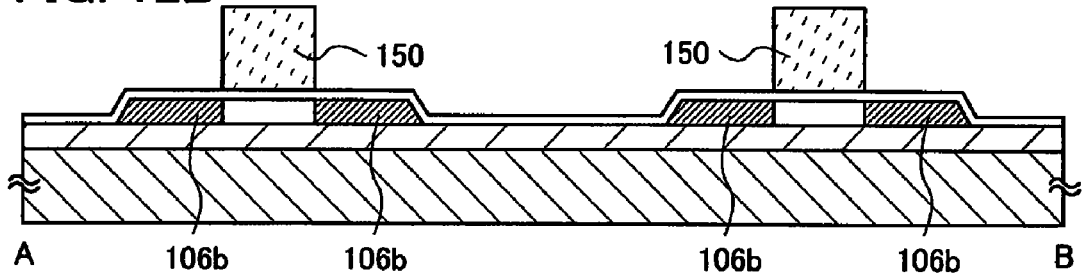

Next, resists 150 are selectively formed over the semiconductor films 106 with the gate insulating film 108 interposed therebetween, and then a first impurity element is introduced into the semiconductor films 106 by using the resists 150 as masks, so that the impurity regions 106b are formed (see FIG. 12B). As the first impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used for the impurity element. Note that the impurity regions 106b function as source and drain regions in the thin film transistor.

Figure 12C:
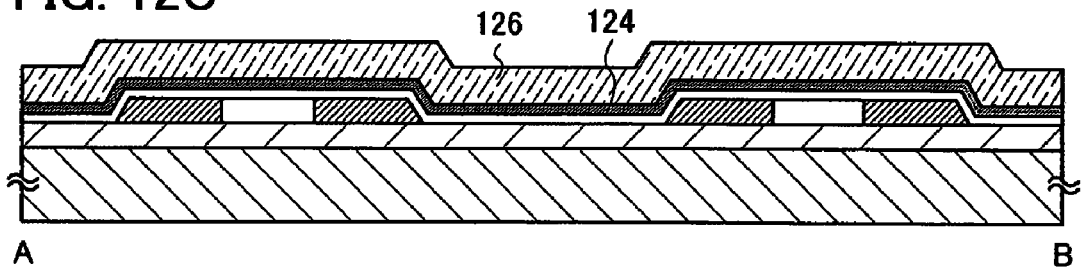

Next, conductive films for forming a gate electrode and a protective film are formed over the gate insulating film 108. Here, a conductive film 124 and a conductive-film 126 are sequentially stacked (see FIG. 12C). The conductive film 124 is formed to a thickness of 20 to 100 nm by a plasma CVD method or a sputtering method, and the conductive film 126 is formed to a thickness of 100 to 400 nm by a plasma CVD method or a sputtering method. The conductive film 124 and the conductive film 126 are formed using an element selected from silicon (Si), tantalum (Ta), tungsten (W), titanium (Ti), molybdenum (Mo), aluminum (Al), copper (Cu), chromium (Cr), niobium (Nb), and the like, or an alloy material or a compound material containing any of the above elements as its main component. Alternatively, they are formed using a semiconductor material typified by polycrystalline silicon doped with an impurity element such as phosphorus. As examples of a combination of the conductive film 124 and the conductive film 126, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the conductive film 124 and the conductive film 126 are formed. In addition, in a case of a three-layer structure instead of a two-layer structure, a stacked layer structure of a molybdenum film, an aluminum film, and a molybdenum film is preferably employed.

Figure 12D:
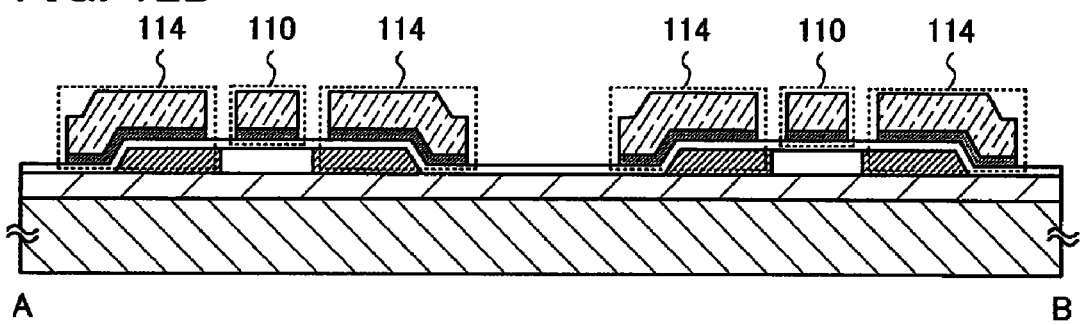

A resist mask is formed by a photolithography method and the conductive film 124 and the conductive film 126 are selectively etched, so that the first conductive films 110 and the second conductive films 114 are formed (see FIG. 12D).

The second conductive films 114 are provided so as to overlap with at least the impurity regions 106b of the semiconductor films 106 and can function as protective films of the semiconductor films 106. In addition, here, the first conductive films 110 functioning as gate electrodes and the second conductive films 114 can be manufactured at the same time in the manufacturing steps. That is, the first conductive films 110 and the second conductive films 114 can be formed of the same material (a stacked-layer structure of the conductive film 124 and the conductive film 126, here) over the same layer (over the gate insulating film 108, here). In that case, the second conductive films 114 can be formed while the number of manufacturing steps is not increased.

Figure 12E:
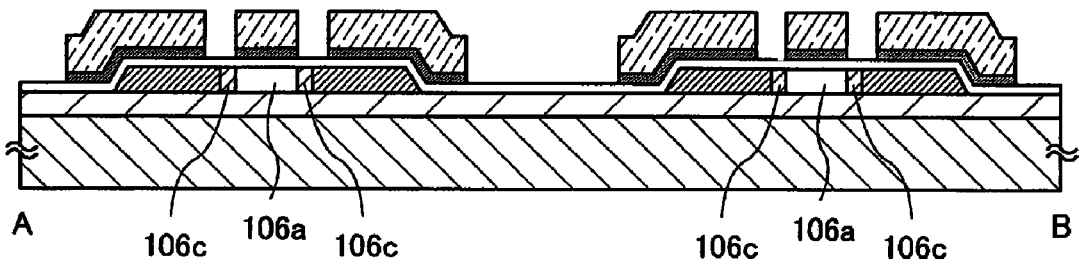

Next, a second impurity element is introduced into the semiconductor films 106 by using the first conductive films 110 and the second conductive films 114 as masks, so that the impurity regions 106c and the channel formation regions 106a are formed (see FIG. 12E). As the second impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, the case is described in which phosphorus (P) is used for the impurity element and an n-channel thin film transistor is formed. Note that the impurity regions 106c function as LDD regions in the thin film transistor.

In this embodiment mode, when the conductive film 124 and the conductive film 126 are selectively etched to form the first conductive films 110 by a photolithography method, the first conductive films 110 are formed so as to have a smaller width than regions of the semiconductor films 106 to which the first impurity element is not introduced (the width of the region in a direction parallel to source region and drain regions), in view of a margin. In such a manner, an alignment margin in formation of a gate electrode can be maintained even in the case of manufacturing a minuter transistor.

Note that the semiconductor device of this embodiment mode is not limited to this structure. Alternatively, a structure may be employed in which the impurity regions 106c are not provided.

Figure 13A:
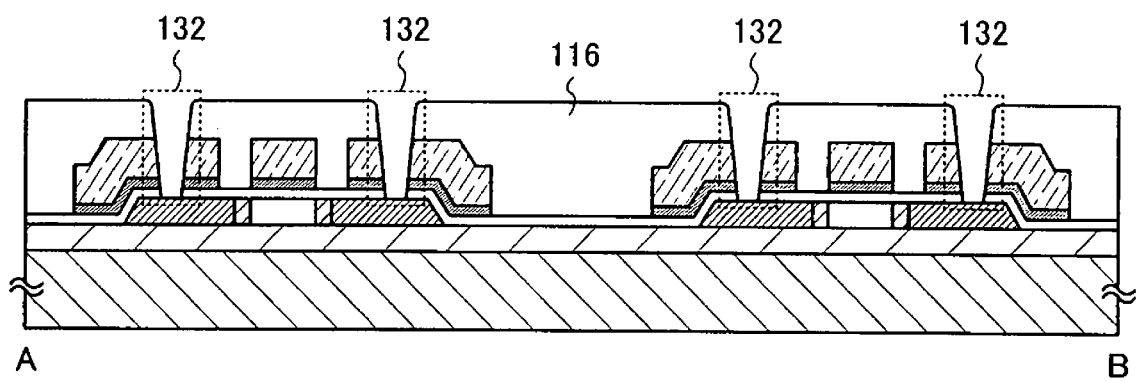
FIGS. 13A and 13B are views showing an example of a method for manufacturing a semiconductor device of the present invention.

After the insulating film 116 is formed so as to cover the first conductive film 110 and the second conductive films 114, the openings 132 which reach the impurity regions 106b of the semiconductor films 106 are formed to partially expose surfaces of the semiconductor films 106 (see FIG. 13A). Here, the gate insulating film 108, the second conductive films 114, and the insulating film 116 are partially etched to form the openings 132.

Figure 13B:
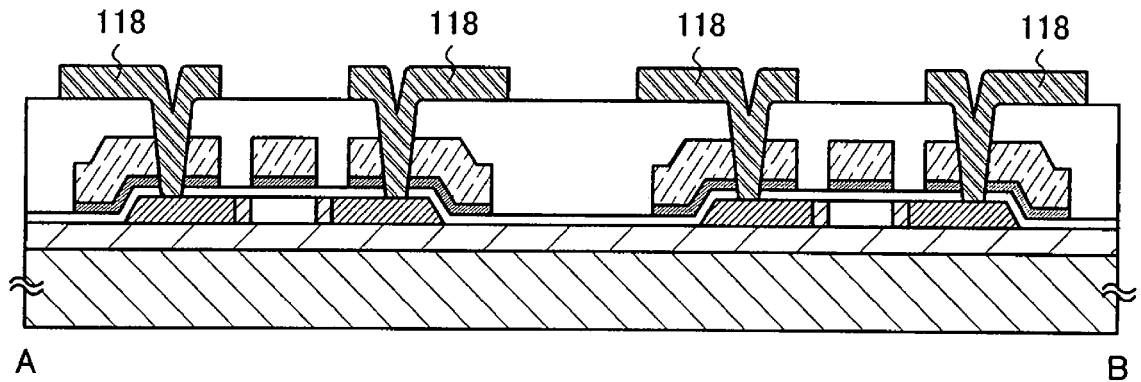

Next, the third conductive films 118 are selectively formed so as to fill the openings 132 and be connected to the impurity regions 106b (see FIG. 13B).

Through the above process, a semiconductor device can be manufactured. Note that, in this embodiment mode, the process is described in which the thin film transistor is directly provided over the substrate 102. Alternatively, a process may be used in which after an element such as a thin film transistor is formed over a supporting substrate, the element is released from the supporting substrate to be transferred to the substrate 102 as described in Embodiment Mode 2. In that case, a supporting substrate over which a release layer is formed may be used instead of the substrate 102.

Note that the methods for manufacturing a semiconductor device, which are shown in FIGS. 12A to 13B, are the methods for manufacturing the semiconductor device shown in FIGS. 9A and 9B. The semiconductor devices shown in FIGS. 10A to 10C and FIG. 11 can also be manufactured by the aforementioned manufacturing methods.

For example, in the case of manufacturing the semiconductor device shown in FIGS. 10A to 10C, the second conductive films 114 may be selectively etched except for a portion of the second conductive films 114 in which the openings 132 are formed later in FIG. 12D.

The case of manufacturing the semiconductor device shown in FIG. 11 is described with reference to FIGS. 14A to 14E.

Figure 14A:
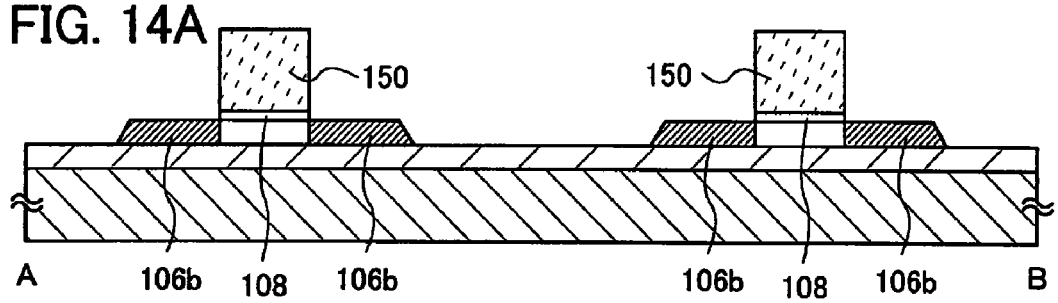
FIGS. 14A to 14E are views showing an example of a method for manufacturing a semiconductor device of the present invention.

First, after a structure up to that shown in FIG. 12B is similarly formed, the gate insulating films 108 are selectively removed using the resists 150 as a mask (see FIG. 14A). Note that, after the gate insulating films 108 are selectively removed, the first impurity element may be introduced to form the impurity regions 106b.

Figure 14B:
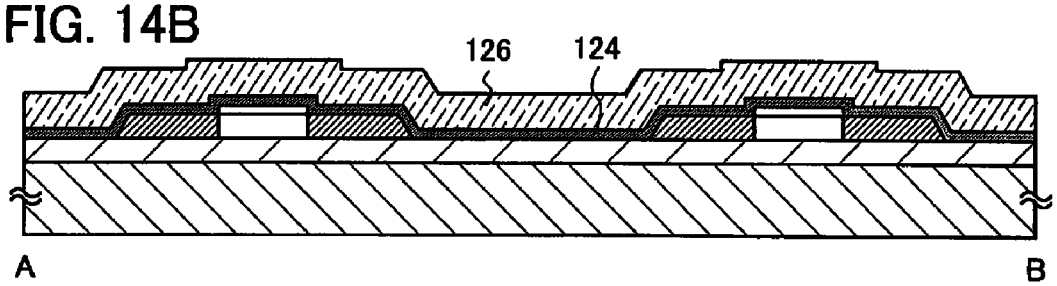
Figure 14C:
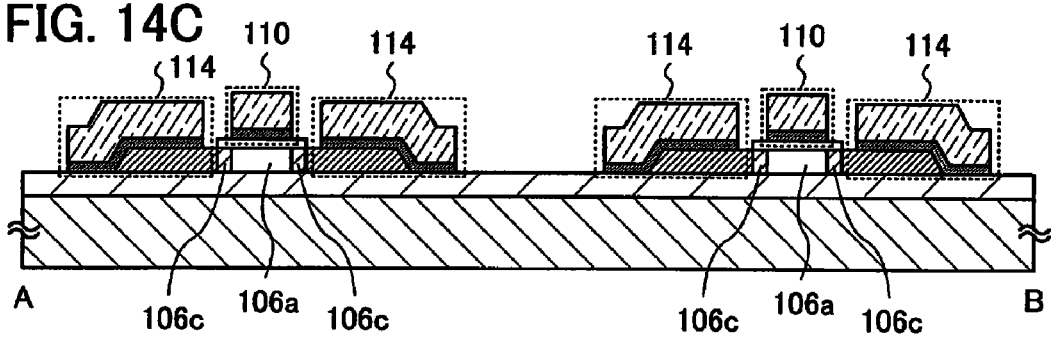

Next, the conductive film 124 and the conductive film 126 are sequentially formed so as to cover the semiconductor films 106 and the gate insulating films 108 (see FIG. 14B).

A resist mask is formed by a photolithography method and the conductive film 124 and the conductive film 126 are selectively etched, so that the first conductive films 110 and the second conductive films 114 are formed. Subsequently, the second impurity element is introduced using the first conductive films 110 and the second conductive films 114 as masks to form the impurity regions 106c and the channel formation regions 106a (see FIG. 14C).

Figure 14D:
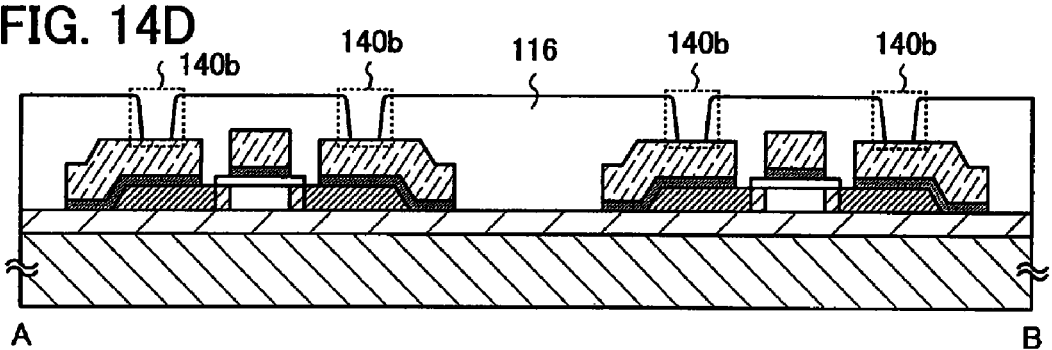

After the insulating film 116 is formed so as to cover the first conductive films 110 and the second conductive films 114, openings 140b which reach the second conductive films 114 are formed to partially expose surfaces of the second conductive films 114 (see FIG. 14D).

Figure 14E:
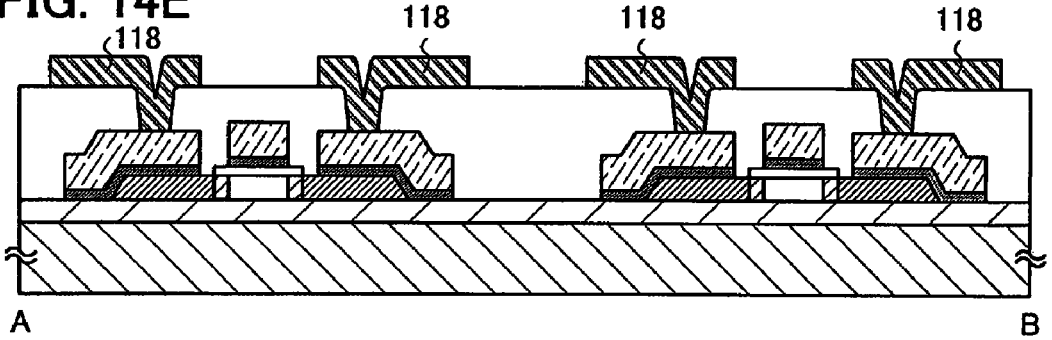

Next, the third conductive films 118 are selectively formed so as to fill the openings 140b and be electrically connected to the second conductive films 114 (see FIG. 14E).

Through the above process, the semiconductor device shown in FIG. 11 can be manufactured.

The structure or the manufacturing method of a semiconductor device, which is described in this embodiment mode, can be combined with that described in any of the other embodiment modes.

Embodiment Mode 5

In this embodiment mode, a semiconductor device which is different from that in any of the above embodiment modes is described with reference to drawings. Specifically, a semiconductor device which is different from that in Embodiment Mode 4 and in which a first conductive film which can function as a gate electrode and a second conductive film which can function as a protective film are formed of the same material at the same time is described.

Figure 15A:
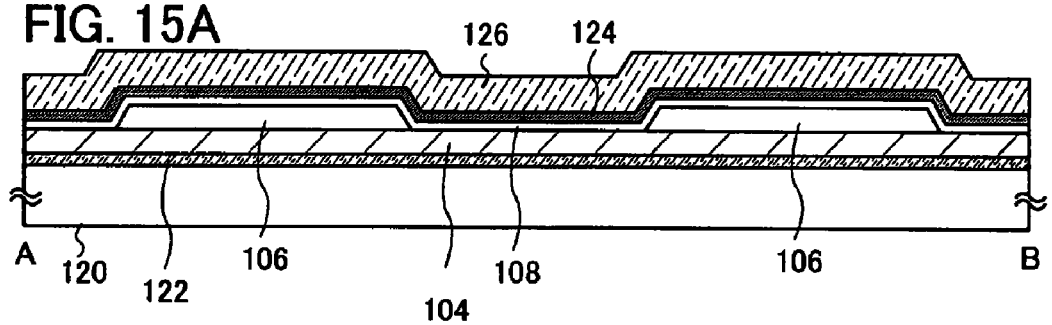
FIGS. 15A to 15E are views showing an example of a method for manufacturing a semiconductor device of the present invention.

First, a structure up to that shown in FIG. 4B of Embodiment Mode 2 is similarly formed (see FIG. 15A).

Figure 15B:
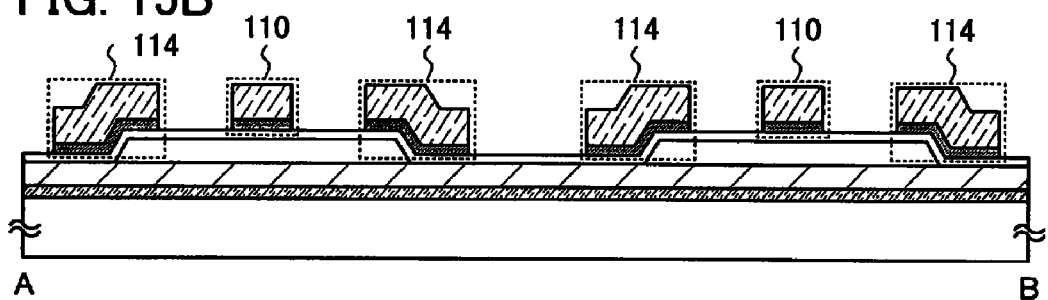

A resist mask is formed by a photolithography method and the conductive film 124 and the conductive film 126 are selectively etched, so that the first conductive films 110 and the second conductive films 114 are formed (see FIG. 15B).

Figure 15C:
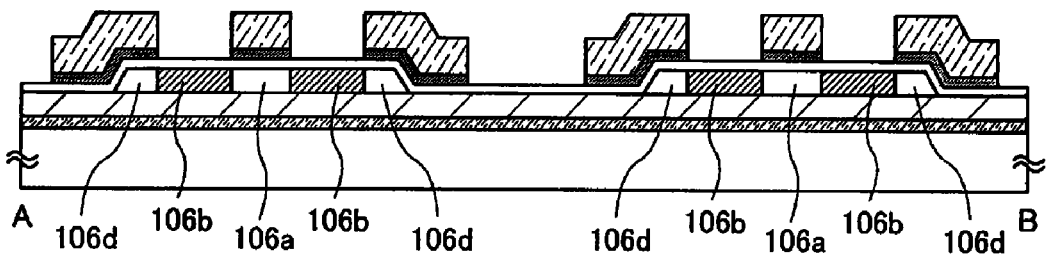

Next, an impurity element is introduced into the semiconductor films 106 by using the first conductive films 110 and the second conductive films 114 as masks, so that the impurity regions 106b, the channel formation regions 106a, and regions 106d are formed (see FIG. 15C). As the impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, boron (B) is used for the impurity element and a p-channel thin film transistor is formed. It is needles to say that phosphorus (P) may be introduced to form an n-channel thin film transistor. Note that the impurity regions 106b function as source and drain regions in the thin film transistor.

An impurity element is not introduced into the regions 106d formed in the semiconductor films 106 below the second conductive films 114, and concentration of impurity elements included in the semiconductor films 106 is approximately the same as that in the channel formation regions 106a. For example, in the case where an impurity element is introduced into the semiconductor film 106 in advance in order to control a threshold voltage of the transistor, similar impurity element is included in the channel formation regions 106a and the regions 106d.

Figure 15D:
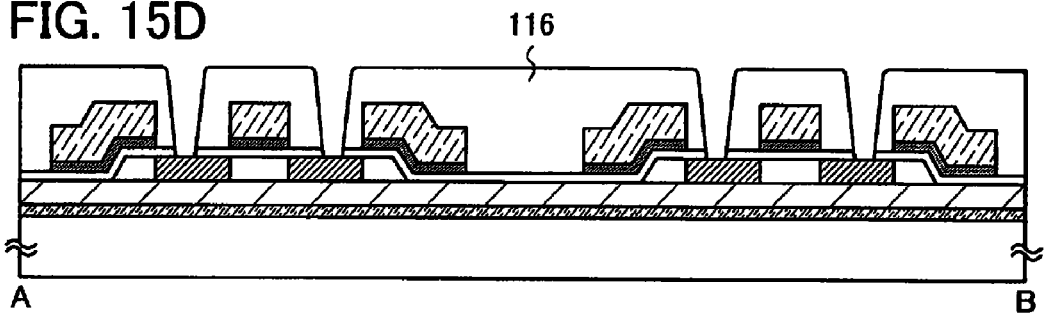

After the insulating film 116 is formed so as to cover the first conductive films 110 and the second conductive films 114, openings which reach the impurity regions 106b of the semiconductor films 106 are formed to partially expose surfaces of the semiconductor films 106 (see FIG. 15D).

Figure 15E:
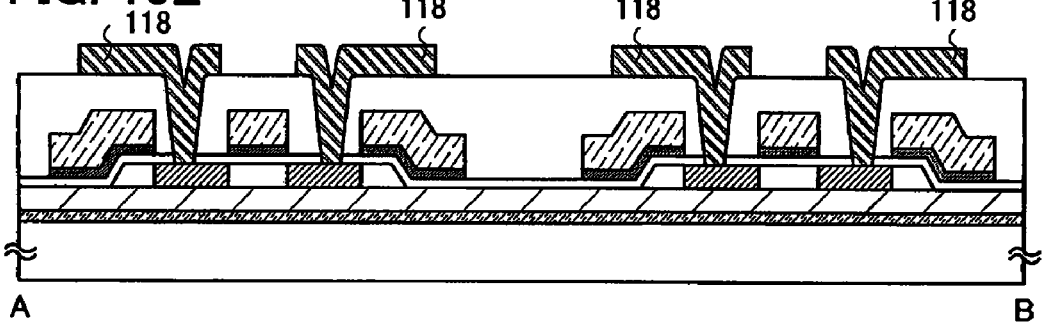

Next, the third conductive films 118 are selectively formed so as to fill the openings and be electrically connected to the impurity regions 106b (see FIG. 15E).

After that, a semiconductor device is manufactured through the process shown in FIGS. 5B to 5D. Note that, in this embodiment mode, the process is described in which after a thin film transistor is formed over a supporting substrate, the element is released from the supporting substrate to be transferred to another substrate; however, the manufacturing method described in this embodiment mode is not limited to this. For example, the thin film transistors 100a and 100b may be directly provided over the substrate 102.

As shown in FIGS. 2B and 10B, the second conductive films 114 and the third conductive films 118 may be provided so as to be in contact with each other, or as shown in FIGS. 7A and 7B, insulating films (side walls) which are in contact with side surfaces of the first conductive films 110, and LDD regions may be provided.

Note that the structure or the manufacturing method of a semiconductor device, which are described in this embodiment mode, can be combined with that described in any of the other embodiment modes.

Embodiment Mode 6

In this embodiment mode, a semiconductor device which is different from that in any of the above embodiment modes is described with reference to drawings. Specifically, a semiconductor device is described in which a layer to be a protective film of a thin film transistor is provided below the thin film transistor.

An example of the semiconductor device described in this embodiment mode is described with reference to FIGS. 16A and 16B. Note that FIG. 16A shows a top plan view and FIG. 16B shows a cross-sectional view taken along a line A-B in FIG. 16A.

Figure 16A:
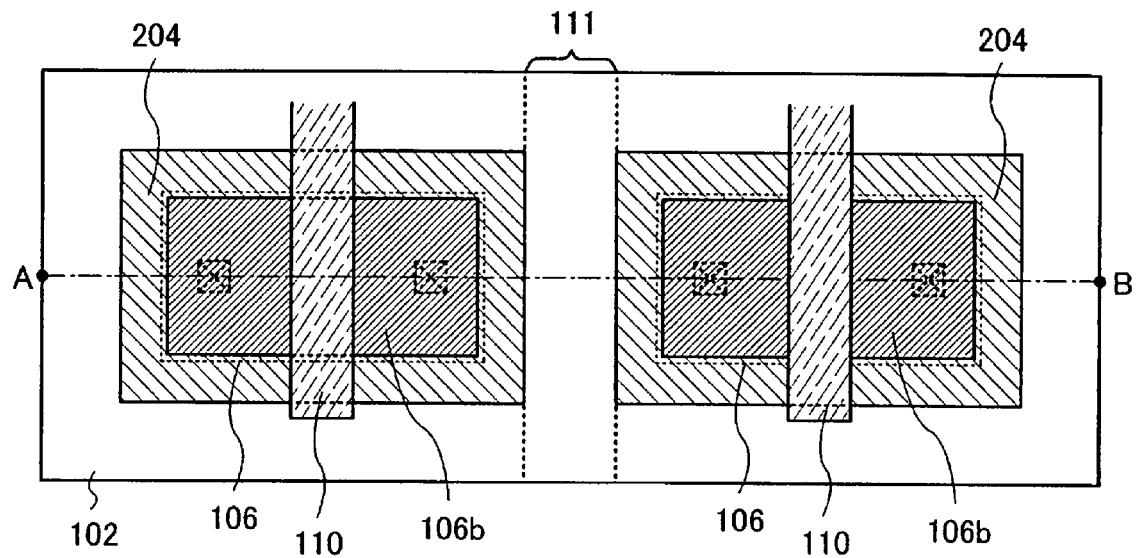
FIGS. 16A and 16B are views showing an example of a semiconductor device of the present invention.
Figure 16B:
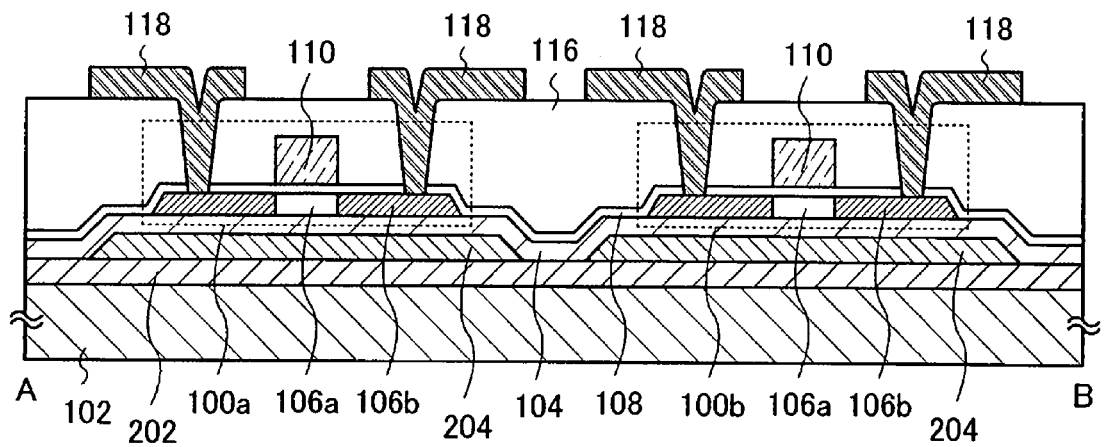

In the semiconductor device shown in FIGS. 16A and 16B, the thin film transistors 100a and 100b are provided over protective films 204 which are provided over the substrate 102. The protective films 204 having island shapes are provided so as to overlap with the semiconductor films 106 having island shapes, which are included in the thin film transistors 100a and 100b, with the insulating film 104 interposed therebetween. Further, the protective films 204 are each provided so as to have a larger area than the semiconductor film 106. In addition, in the semiconductor device shown in FIGS. 16A and 16B, the protective films 204 are provided instead of the second conductive films 114 in the semiconductor device shown in FIGS. 1A and 1B. Note that explanation for similar portions to those in FIGS. 1A and 1B is omitted.

Thus, by providing the protective films 204 so as to overlap with the thin film transistor, the stress is concentrated in the region 111 (between the thin film transistors 100a and 100b) where an element such as a transistor is not formed (the semiconductor device is bent in the region 111) even in the case where the semiconductor device is stressed by, for example, being bent; therefore, damages and breakages of the thin film transistors 100a and 100b can be reduced. In particular, by providing each of the protective films 204 so as to overlap with an entire surface of the semiconductor film 106, it becomes possible to efficiently reduce damages on the semiconductor film 106 in the manufacturing process of the semiconductor device or utilization after completion thereof and thereby improve the yield and reliability of the semiconductor device.

The protective film 204 is formed using an element selected from silicon (Si), tantalum (Ta), tungsten (W), titanium (Ti), molybdenum (Mo), aluminum (Al), copper (Cu), chromium (Cr), niobium (Nb), and the like, or an alloy material or a compound material containing any of the above elements as its main component. In addition, the protective film 204 may have a single-layer structure or a stacked-layer structure of two or more layers.

Note that FIGS. 16A and 16B show an example in which one of the protective films 204 having island shapes is provided under one of the semiconductor films 106 having island shapes; however, the present invention is not limited to this. Alternatively, one of the protective films 204 having island shapes may be provided so as to overlap with the plurality of semiconductor films 106 having island shapes. In the case of providing one of the protective films 204 having island shapes so as to overlap with the plurality of semiconductor films 106 having island shapes, steps at end portions of the protective films 204 can be reduced; therefore, breaking of the semiconductor films 106 due to misalignment of a mask or the like can be prevented.

Subsequently, an example of a method for manufacturing the semiconductor device described above is described with reference to drawings. Note that, here, the process is described in which after an element such as a thin film transistor is formed over a supporting substrate, the element is released from the supporting substrate to be transferred to another substrate.

Figure 17A:
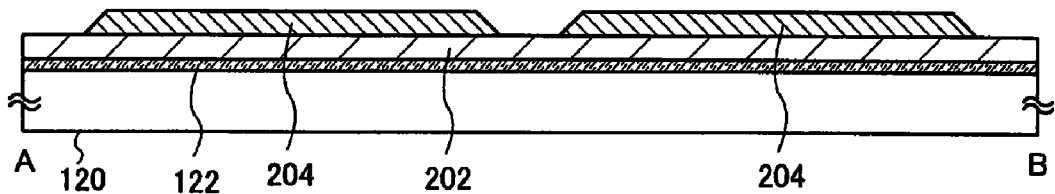
FIGS. 17A to 17E are views showing an example of a method for manufacturing a semiconductor device of the present invention.

The release layer 122 is formed on one surface of the substrate 120, and then an insulating film 202 to be a base and the protective film are formed. Note that the release layer 122, the insulating film 202, and the protective film can be formed successively. Subsequently, the protective film is selectively etched to form the protective films 204 having island shapes (see FIG. 17A).

The insulating film 202 to be the base is formed by a layer containing oxide of silicon or nitride of silicon in a single-layer or stacked-layer structure with a layer containing oxide of silicon or nitride of silicon by sputtering, plasma CVD, or the like. In the case where the insulating layer to be the base has a two-layer structure, a silicon nitride oxide layer may be formed as a first layer, and a silicon oxynitride layer may be formed as a second layer, for example. In the case where the insulating layer to be a base has a three-layer structure, a silicon oxide layer, a silicon nitride oxide layer, and a silicon oxynitride layer may be formed as a first-layer insulating layer, a second-layer insulating layer, and a third-layer insulating layer respectively. Alternatively, a silicon oxynitride layer, a silicon nitride oxide layer, and a silicon oxynitride layer may be formed as a first-layer insulating layer, a second-layer insulating layer, and a third-layer insulating layer respectively.

The protective film is formed using an element selected from silicon (Si), tantalum (Ta), tungsten (W), titanium (Ti), molybdenum (Mo), aluminum (Al), copper (Cu), chromium (Cr), niobium (Nb), and the like, or an alloy material or a compound material containing any of the above elements as its main component. In addition, the protective film 204 may have a single-layer structure or a stacked-layer structure of two or more layers. Here, an amorphous semiconductor film (for example, a film containing amorphous silicon) is formed over the insulating film 202 and then selectively removed to form the protective films 204 having island shapes.

Figure 17B:
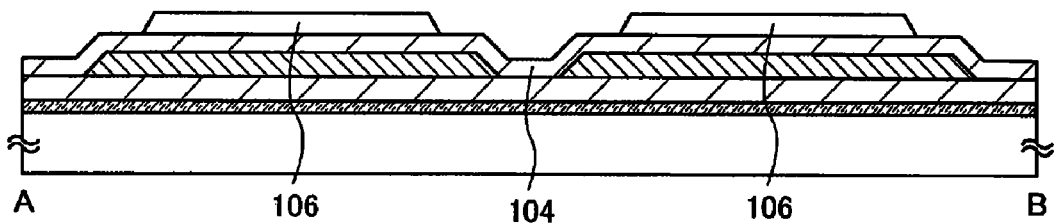

After the insulating film 104 is formed so as to cover the protective films 204, the semiconductor films 106 having island shapes are formed (see FIG. 17B). The insulating film 104 and the semiconductor films 106 may be formed using the materials and the manufacturing methods described in any of the above embodiment modes. In addition, the semiconductor films 106 having island shapes are provided so as to overlap with the protective films 204.

Figure 17C:
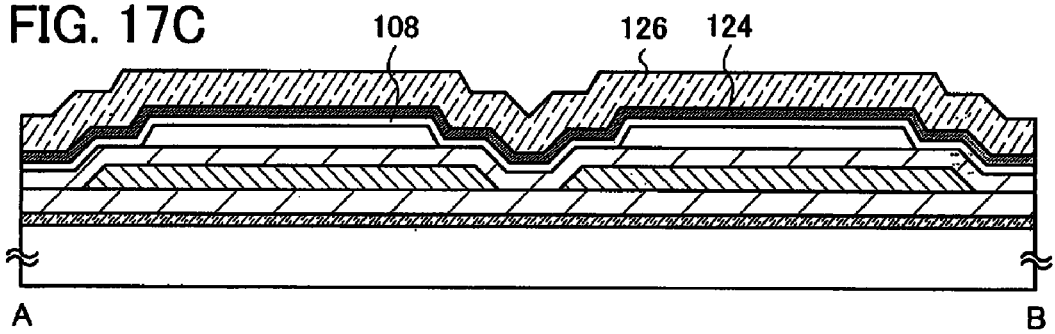

After the gate insulating film 108 is formed so as to cover the semiconductor films 106, the conductive film 124 and the conductive film 126 are sequentially stacked (see FIG. 17C). The gate insulating film 108, the conductive film 124, and the conductive film 126 may be formed using the materials and the manufacturing methods described in any of the above embodiment modes.

Figure 17D:
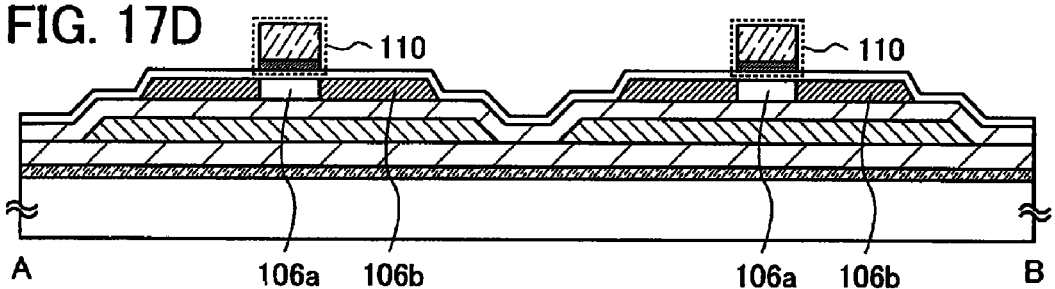

Next, a resist mask is formed by a photolithography method, and the conductive film 124 and the conductive film 126 are selectively etched to form the first conductive films 110. Then, an impurity element is introduced into the semiconductor films 106 by using the first conductive films 110 as masks, so that the impurity regions 106b and the channel formation regions 106a are formed (see FIG. 17D). As the impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used for the impurity element and an n-channel thin film transistor is formed. Note that the impurity regions 106b function as source and drain regions in the thin film transistor.

Figure 17E:
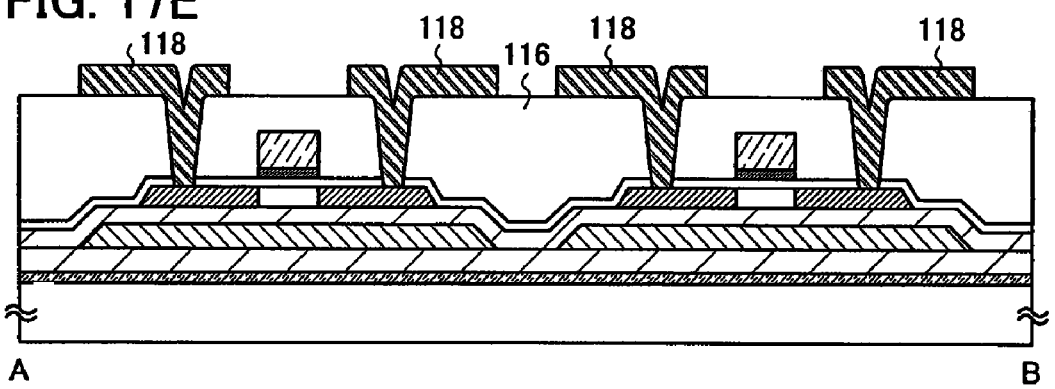

After the insulating film 116 is formed so as to cover the first conductive films 110 and the gate insulating film 108, openings which reach the impurity regions 106b of the semiconductor films 106 are formed, and then the third conducive films 118 are selectively formed so as to fill the openings (see FIG. 17E). The third conducive films 118 function as source and drain electrodes in the thin film transistor.

Figure 18A:
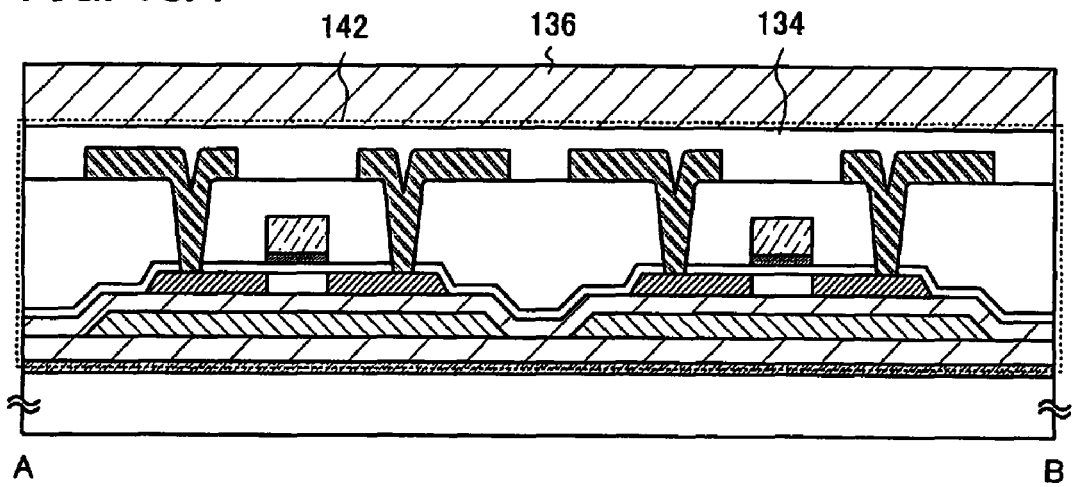
FIGS. 18A to 18C are views showing an example of a method for manufacturing a semiconductor device of the present invention.

Next, the insulating film 134 is provided so as to cover the third conductive films, and a first sheet material 136 is attached to a surface of the insulating film 134 (see FIG. 18A).

Figure 18B:
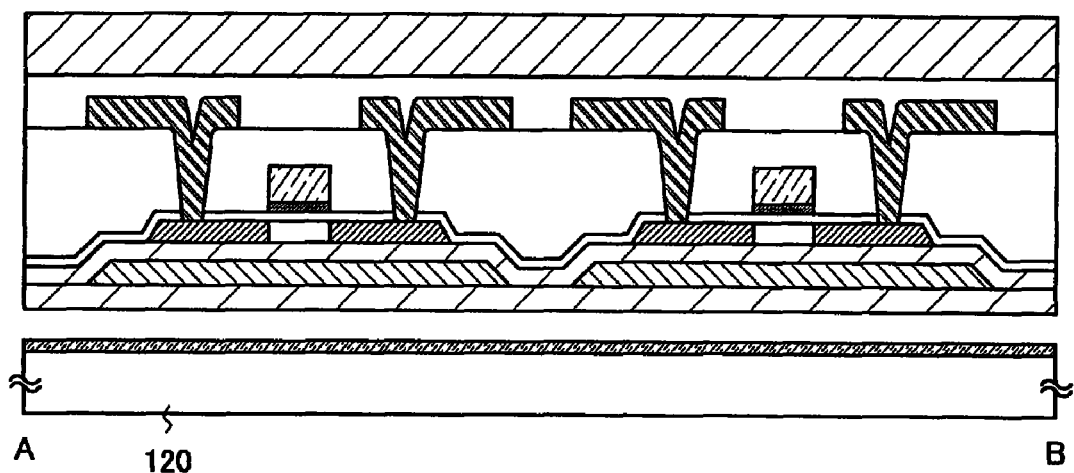

Next, an element formation layer 142 including the thin film transistors 100a and 100b and the like is released from the substrate 120 (see FIG. 18B). Here, the element formation layer 142 is released from the substrate 120 by using physical force.

Figure 18C:
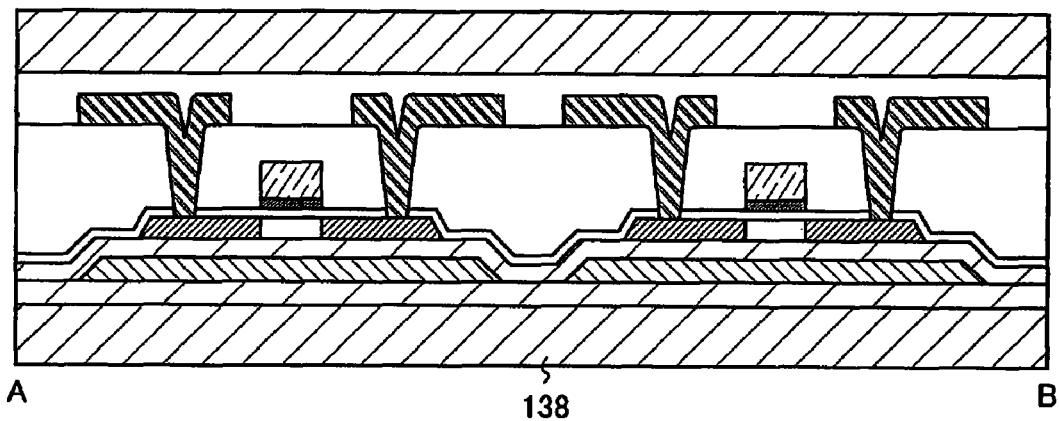

Next, the second sheet material 138 is provided on the other surface (the surface released from the substrate 120) of the element formation layer 142, and then one or both of heat treatment and pressure treatment are performed to attach the second sheet material 138 to the element formation layer 142 (see FIG. 18C). As the first sheet material 136 and the second sheet material 138, a hot-melt film, a plastic substrate over which an adhesive layer is formed, or the like can be used.

Through the above process, a semiconductor device can be manufactured. Note that, in FIGS. 17A to 18C, the process is described in which after a thin film transistor is formed over a supporting substrate, the element is released from the supporting substrate to be transferred to another substrate; however, the manufacturing method is not limited to this. For example, the thin film transistors 100a and 100b may be directly provided over the substrate 102 as described in Embodiment mode 4.

Note that FIG. 16A and 16B show an example in which each of the protective films 204 is provided so as to overlap with an entire surface of the semiconductor film 106; however, the semiconductor device of this embodiment mode is not limited to this structure. The protective films 204 and the semiconductor film 106 may at least partially overlap with each other. An example of such a semiconductor device is described with reference to FIGS. 19A and 19B. Note that FIG. 19A shows a top plan view and FIG. 19B shows a cross-sectional view taken along a line A-B in FIG. 19A.

Figure 19A:
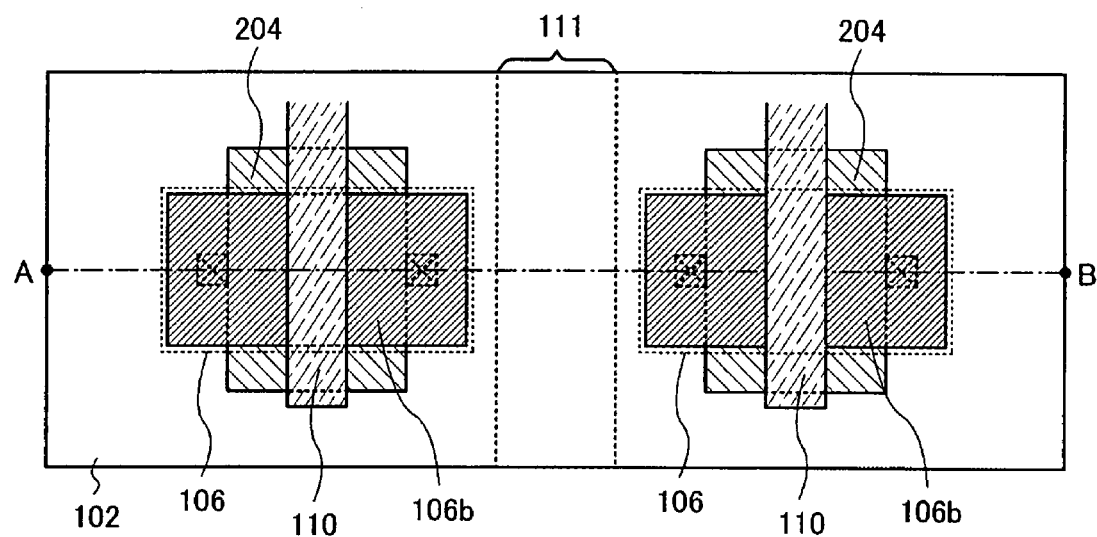
FIGS. 19A and 19B are views showing an example of a semiconductor device of the present invention.
Figure 19B:
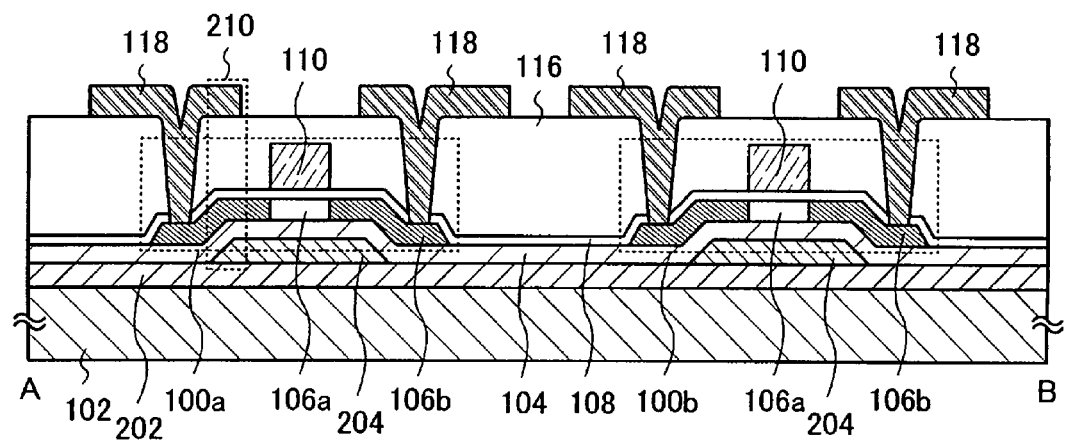

In the semiconductor device shown in FIGS. 19A and 19B, the protective films 204 having island shapes are provided so as to partially overlap with the semiconductor films 106 having island shapes, which are included in the thin film transistors 100a and 100b, with the insulating film 104 interposed therebetween. In the case of thus providing the protective films 204, each of the protective films 204 are preferably provided so as to overlap with an entire surface of the channel formation region 106a of the semiconductor film 106 and part of the impurity region 106b. This is because the conductive films 110 functioning as gate electrodes cross over the semiconductor films 106 and thereby generating steps at the end portions of the channel formation regions 106a, and if the protective films 204 are provided so as to overlap with only part of the channel formation regions 106a, the conductive films 110 and the semiconductor films 106 might be short-circuited.

In the case where the protective films 204 are provided so as to overlap with part of the semiconductor films 106, it is preferable to provide the protective films 204 and the third conductive films 118 so as to overlap with each other. FIGS. 19A and 19B show an example in which end portions of the protective films 204 overlap with end portions of the third conductive films 118 in regions 210. By providing of the protective films 204 so as to overlap with the third conductive films 118, the stress is concentrated in the region 111 (between the thin film transistors 100a and 100b) where an element such as a transistor is not formed (the semiconductor device is bent in the region 111) even in the case where the semiconductor device is stressed by, for example, being bent; therefore, damages and breakages of the thin film transistors 100a and 100b can be reduced. That is, by providing the protective films 204 and the third conductive films 118 so as to overlap with the semiconductor films 106, the semiconductor device can be prevented from being bent in portions where the semiconductor films 106 are formed.

Figure 20A:
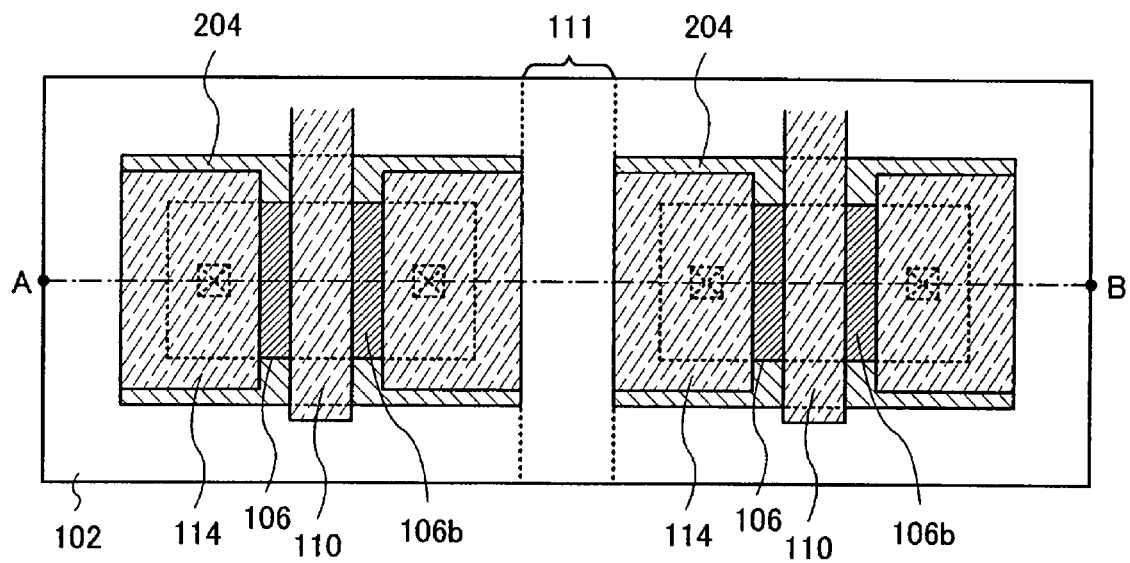
FIGS. 20A and 20B are views showing an example of a semiconductor device of the present invention.

Note that the structure of a semiconductor device, which is described in this embodiment mode, can be combined with that described in any of the other embodiment modes. For example, the structure shown in FIGS. 16A and 16B or FIGS. 19A and 19B in which the second conductive film functioning as a protective film, which is described in any of the above embodiment modes, is additionally provided can be employed. An example of such a semiconductor device is shown in FIGS. 20A to 21B. Note that FIG. 20A shows a top plan view and FIG. 20B shows a cross-sectional view taken along a line A-B in FIG. 20A.

Figure 20B:
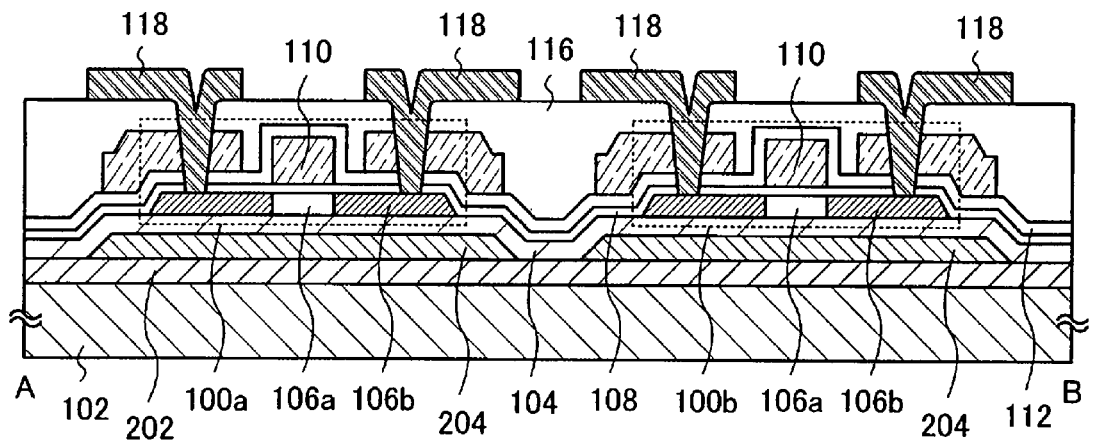

The semiconductor device shown in FIGS. 20A and 20B is provided to have the structure of FIGS. 1A and 1B described in Embodiment Mode 1 and the structure of FIGS. 16A and 16B described in this embodiment mode in combination. At least part of the semiconductor films 106 is sandwiched between the protective films 204 and the second conductive films 114. Thus, by providing the semiconductor films 106 so as to overlap with the protective films 204 and the second conductive films 114, even in the case where the semiconductor device is stressed by, for example, being bent, the semiconductor device is prevented from being bent in portions of the semiconductor films 106 and thereby damages and breakages of the thin film transistors 100a and 100b can be reduced.

Figure 21A:
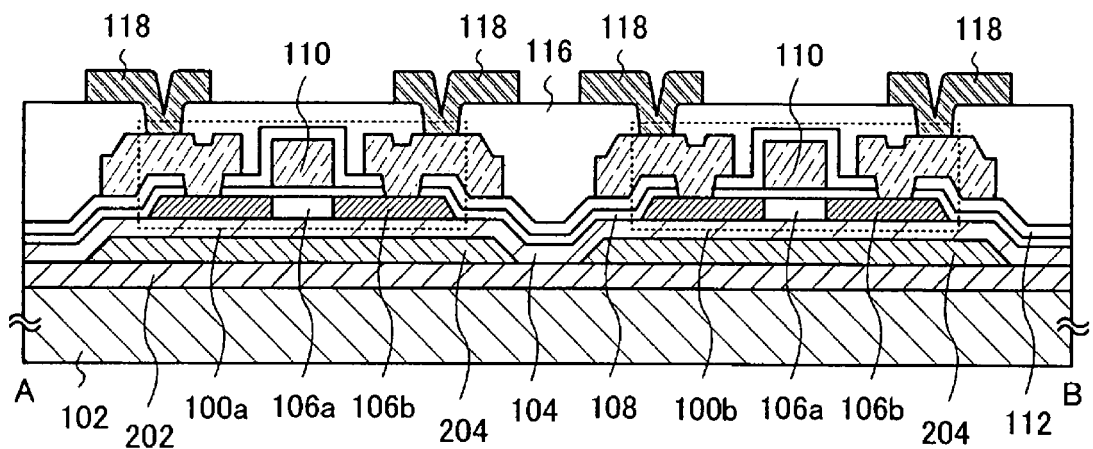
FIGS. 21A and 21B are views each showing an example of a semiconductor device of the present invention.
Figure 21B:
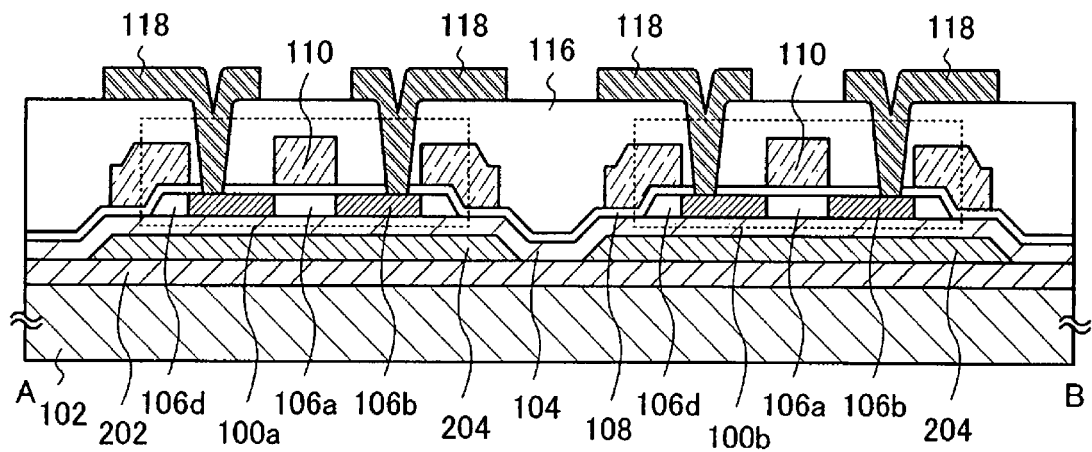

Further, the semiconductor device shown in FIG. 21A is provided to have the structure of FIG. 3A described in Embodiment Mode 1 and the structure of FIGS. 16A and 16B described in this embodiment mode in combination. The semiconductor device shown in FIG. 21B is provided to have the structure of FIG. 15E described in Embodiment Mode 5 and the structure of FIGS. 16A and 16B described in this embodiment mode in combination.

Thus, by combining the structure of a semiconductor device, which is described in this embodiment mode and that described in any of the above embodiment modes, it is possible to efficiently reduce damages of the semiconductor films 106 (and further the thin film transistors 100a and 100b) even in the case where the semiconductor films 106 are stressed by, for example, being bent in the manufacturing process of the semiconductor device or utilization after completion thereof, and thereby improve the yield and reliability of the semiconductor device. Note that the structure described in this embodiment mode can be freely combined with that described in any of the above embodiment modes, like the structure of FIGS. 20A and 20B and the structure of FIGS. 21A and 21B.

Embodiment Mode 7

In this embodiment mode, a semiconductor device which is different from that in any of the above embodiment modes is described with reference to drawings. Specifically, a semiconductor device is described in which a layer to be a protective film of a thin film transistor is provided so as not to overlap with a semiconductor film of the thin film transistor.

An example of the semiconductor device described in this embodiment mode is described with reference to FIGS. 22A and 22B. Note that FIG. 22A shows a top plan view and FIG. 22B shows a cross-sectional view taken along a line A-B in FIG. 22A.

Figure 22A:
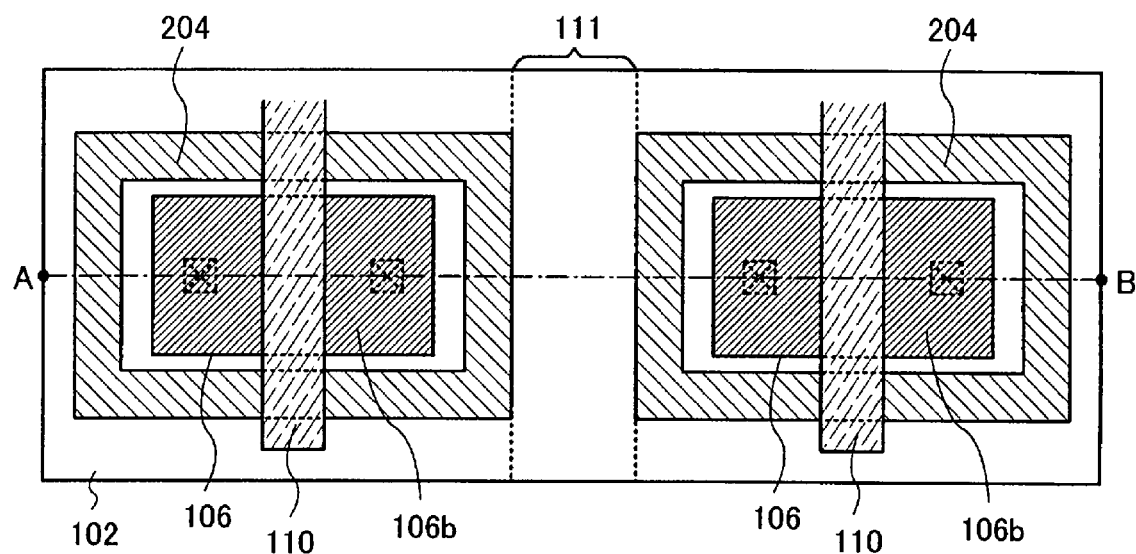
FIGS. 22A and 22B are views showing an example of a semiconductor device of the present invention.
Figure 22B:
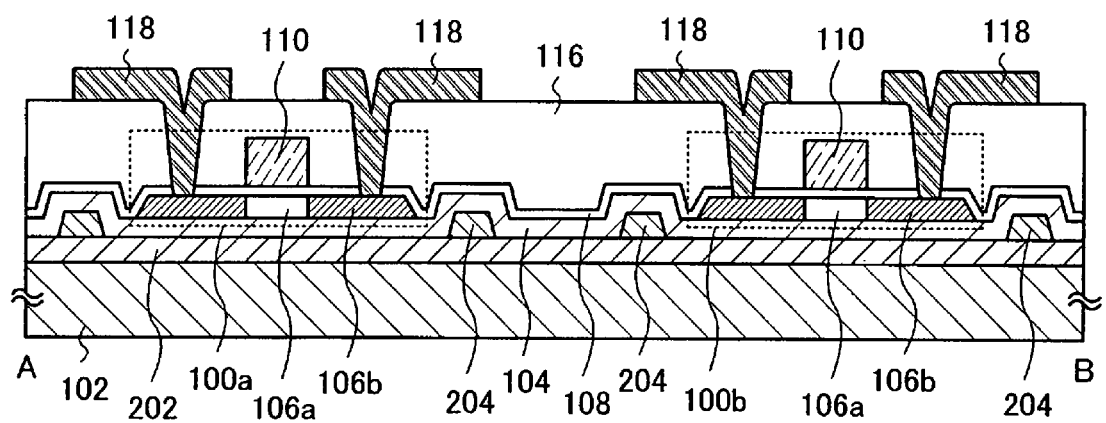

In the semiconductor device shown in FIGS. 22A and 22B, the protective films 204 over the substrate 102 are provided so as to surround the thin film transistors 100a and 100b. Specifically, the protective films 204 are provided so as to surround the semiconductor films 106 included in the thin film transistors 100a and 100b and the protective films 204 are provided below the semiconductor films 106 so as not to overlap with the semiconductor films 106 in a direction perpendicular to a surface of the substrate 102. In the case of providing the semiconductor films 106 and the protective films 204 so as not to overlap with each other, less steps are generated in the semiconductor films 106 as compared to the case of providing them so as to overlap with each other; therefore, breaking of the semiconductor films 106 can be suppressed.

Thus, by providing the protective films 204 so as to surround the semiconductor films 106, the stress is concentrated in the region 111 (between the thin film transistors 100a and 100b) where an element such as a transistor is not formed (the semiconductor device is bent in the region 111) even in the case where the semiconductor device is stressed by, for example, being bent; therefore, damages and breakages of the thin film transistors 100a and 100b can be reduced. Further, by providing the protective films 204 and the third conductive films 118 so as to overlap with each other, the semiconductor films 106 can be protected from above and below. Therefore, it becomes possible to efficiently reduce damages and breakages of the semiconductor films 106 and thereby improve the yield and reliability of the semiconductor device.

Note that the structure of a semiconductor device, which is described in this embodiment mode, can be combined with that described in any of the above embodiment modes.

For example, the structure shown in FIGS. 22A and 22B in which the second conductive film functioning a protective film, which is described in any of the above embodiment modes, is additionally provided can be employed. An example thereof is shown in FIGS. 23A and 23B.

Figure 23A:
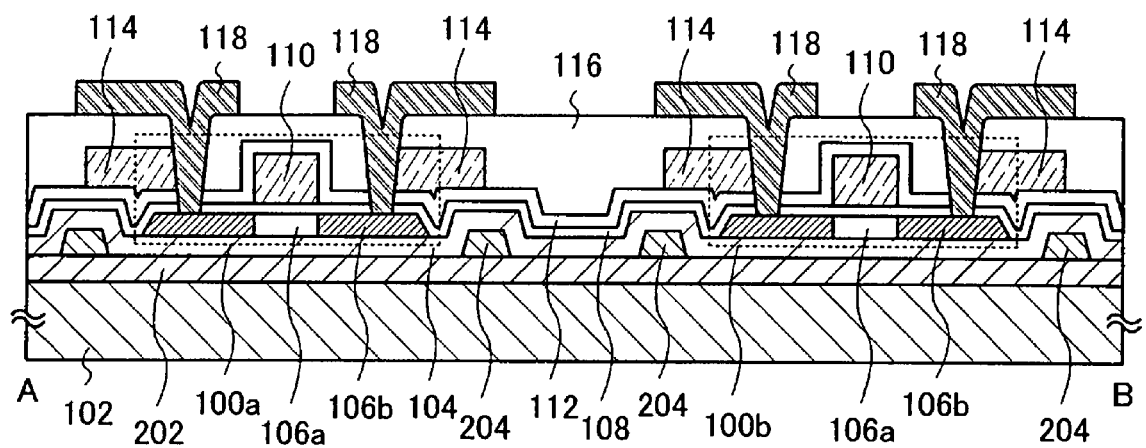
FIGS. 23A and 23B are views each showing an example of a semiconductor device of the present invention.

The semiconductor device shown in FIG. 23A is provided to have the structure of FIG. 2A described in Embodiment Mode 1 and the structure of FIGS. 22A and 22B described in this embodiment mode in combination. Note that, here, an example is shown in which the second conductive films 114 and the protective films 204 are provided so as to overlap with each other. By providing the protective films 204 provided around the semiconductor films 106 so as to overlap with the second conductive films 114, the semiconductor device is prevented from being bent in portions of the semiconductor films 106 even in the case where the semiconductor device is stressed by, for example, being bent; therefore, damages and breakages of the thin film transistors 100a and 100b can be reduced.

Figure 23B:
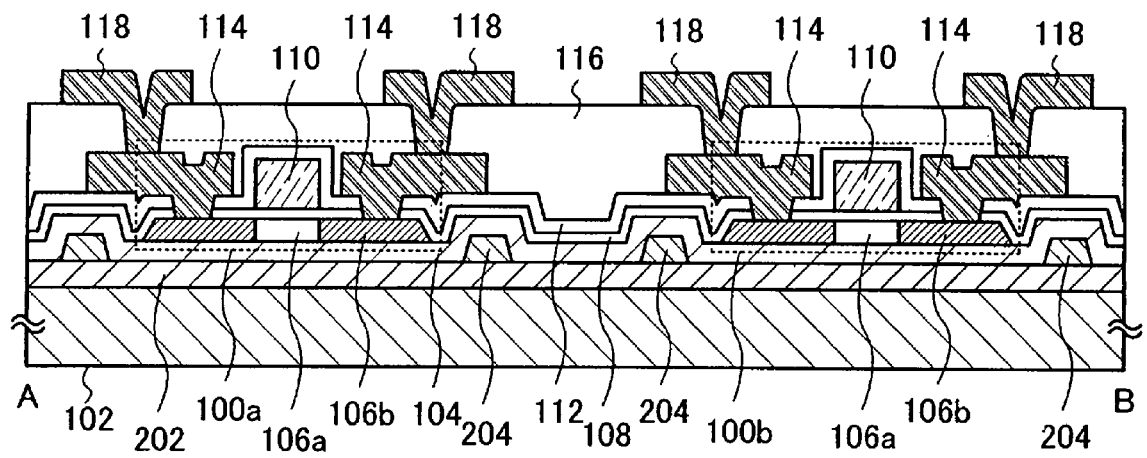

The semiconductor device shown in FIG. 23B is provided to have the structure of FIG. 3A described in Embodiment Mode 1 and the structure of FIGS. 22A and 22B described in this embodiment mode in combination. Note that, here, an example is shown in which the second conductive films 114 and the protective films 204 are provided so as to overlap with each other. By providing the protective films 204 provided around the semiconductor films 106 so as to overlap with the second conductive films 114, the semiconductor device is prevented from being bent in portions of the semiconductor films 106 even in the case where the semiconductor device is stressed by, for example, being bent; therefore, damages and breakages of the thin film transistors 100a and 100b can be reduced.

Thus, by combining the structure of a semiconductor device, which is described in this embodiment mode and that described in any of the above embodiment modes, it is possible to efficiently reduce damages of the semiconductor films 106 (and further the thin film transistors 100a and 100b) even in the case where the semiconductor films 106 are stressed by, for example, being bent in the manufacturing process of the semiconductor device or utilization after completion thereof, and thereby improve the yield and reliability of the semiconductor device. Note that the structure of FIGS. 23A and 23B is just an example, and the structure described in this embodiment mode can be freely combined with that described in any of the above embodiment modes.

Embodiment Mode 8

In this embodiment mode, a semiconductor device which is different from that in any of the above embodiment modes is described with reference to drawings. Specifically, a semiconductor device is described in which a layer to be a protective film of a thin film transistor is provided over the thin film transistor.

An example of the semiconductor device described in this embodiment mode is described with reference to drawings.

First, the case of providing protective films over the thin film transistors 100a and 100b is described with reference to FIGS. 24A to 24C. Note that FIG. 24A shows a top plan view and FIGS. 24B and 24C each show a cross-sectional view taken along a line A-B in FIG. 24A.

Figure 24A:
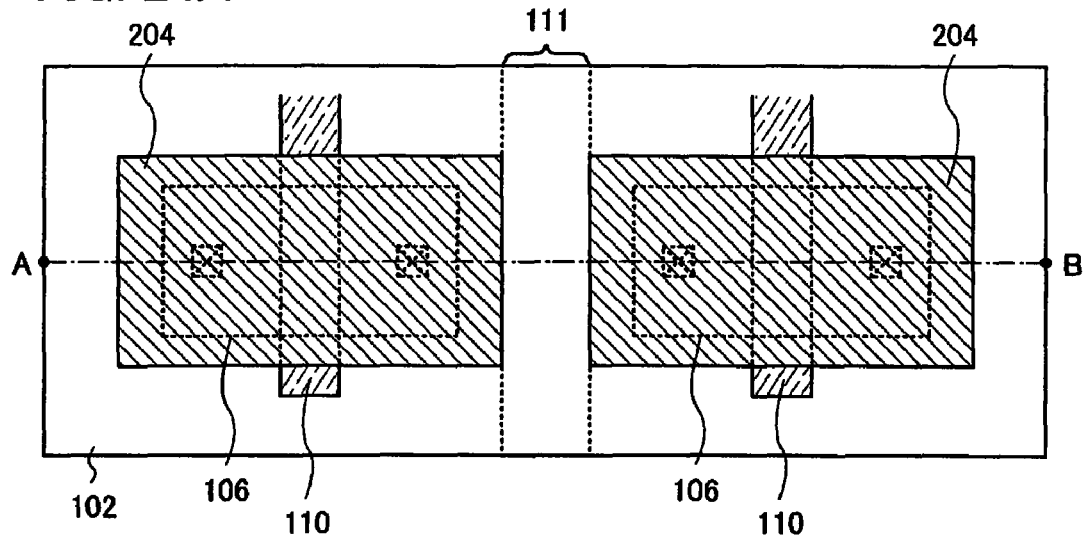
FIGS. 24A to 24C are views showing examples of a semiconductor device of the present invention.
Figure 24B:
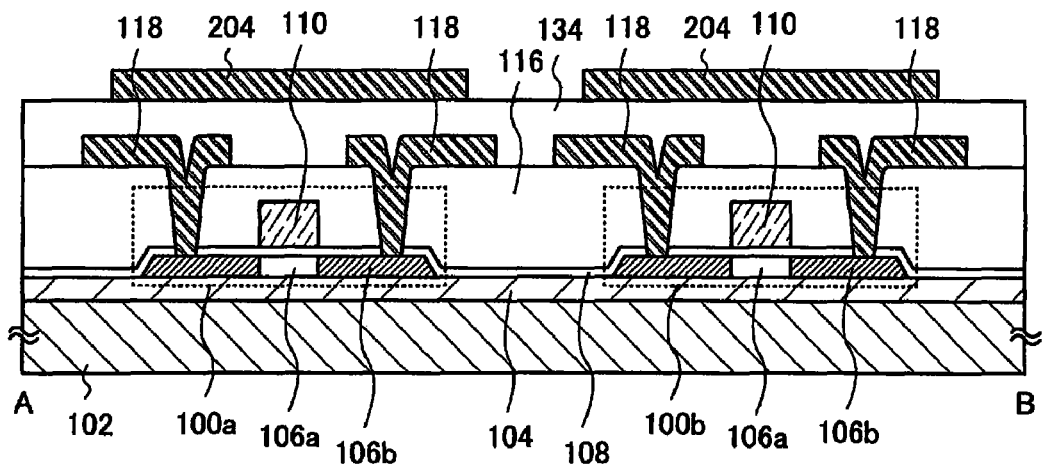
Figure 24C:
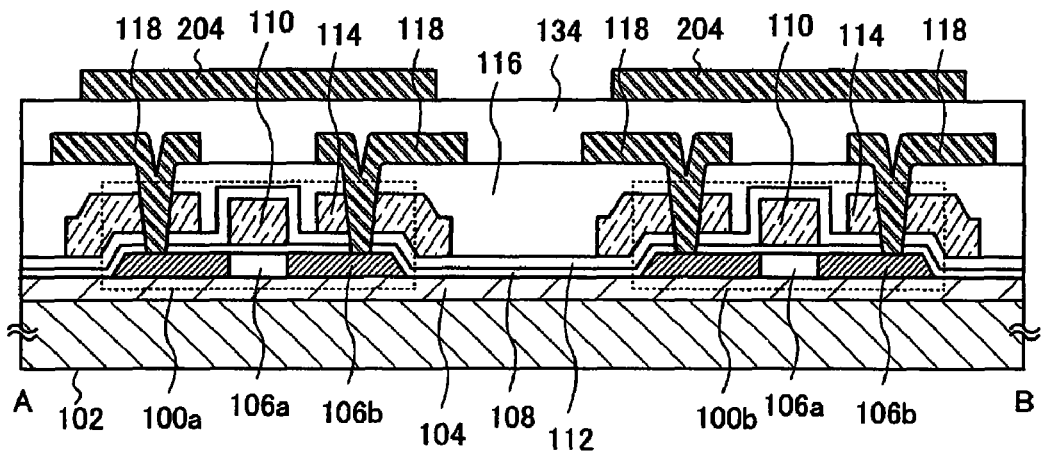

In the semiconductor device shown in FIGS. 24A to 24C, the protective films 204 are provided over the thin film transistors 100a and 100b with an insulating film (here, the insulating film 134) interposed therebetween. The protective films 204 having island shapes are provided so as to overlap with the semiconductor films 106 having island shapes, which are included in the thin film transistors 100a and 100b, with an insulating film or the like interposed therebetween. Further, the protective films 204 are each provided so as to have a larger area than the semiconductor film 106.

Thus, by providing the protective films 204 so as to overlap with the thin film transistor, even in the case where the semiconductor device is stressed by, for example, being bent, the stress is concentrated in a region 111 (between the thin film transistors 100a and 100b) where an element such as a transistor is not formed (the semiconductor device is bent in the region 111) and thereby damages and breakages of the thin film transistors 100a and 100b can be reduced. In particular, by providing each of the protective films 204 so as to overlap with an entire surface of the semiconductor film 106, it becomes possible to efficiently reduce damages of the semiconductor film 106 in the manufacturing process of the semiconductor device or utilization after completion thereof and thereby improve the yield and reliability of the semiconductor device. It is needless to say that each of the protective films 204 do not necessarily overlap with an entire surface of the semiconductor film 106 and each of the protective films 204 may be provided so as to overlap with at least part of the semiconductor film 106.

Alternatively, a structure may be employed in which the second conductive films 114 described in any of the above embodiment modes are provided as well as the protective films 204. For example, as shown in FIG. 24C, the structure of FIGS. 1A and 1B described in Embodiment Mode 1, in which the protective films 204 are additionally provided, may be employed. Thus, by providing the second conductive films 114 and the protective films 204, even in the case where the semiconductor device is stressed, damages and breakages of the thin film transistors 100a and 100b can be efficiently reduced.

Next, the case of providing the protective films 204 so as to surround the thin film transistors 100a and 100b is described with reference to FIGS. 25A and 25B. Note that FIG. 25A shows a top plan view and FIG. 25B shows a cross-sectional view taken along a line A-B in FIG. 25A.

Figure 25A:
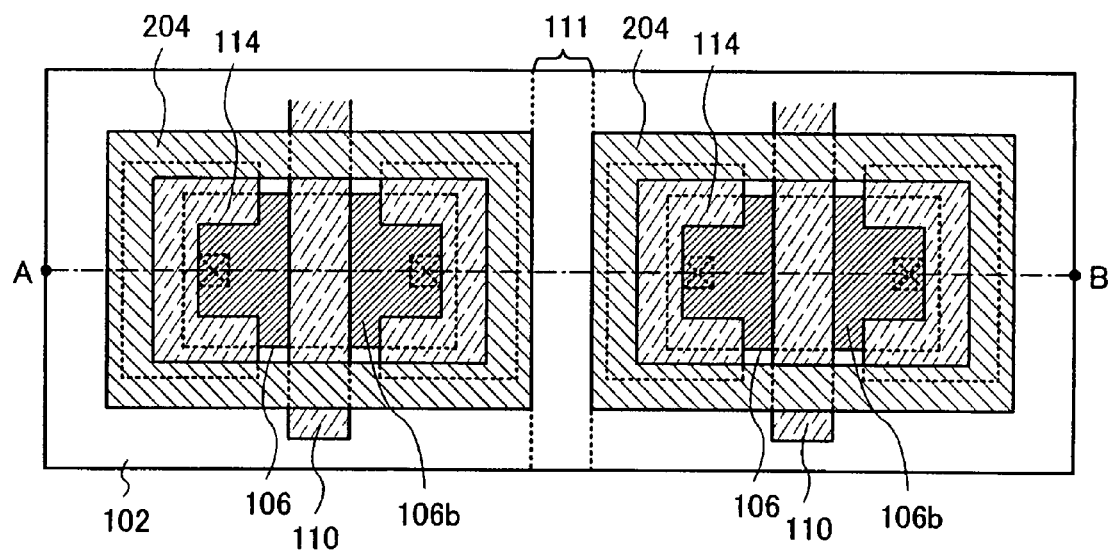
FIGS. 25A and 25B are views showing an example of a semiconductor device of the present invention.
Figure 25B:
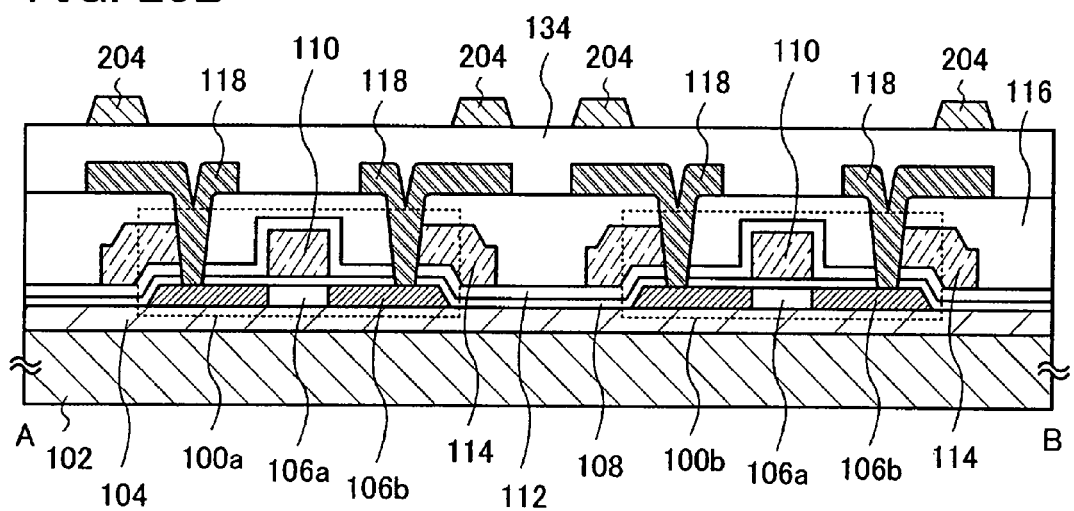

In the semiconductor device shown in FIGS. 25A and 25B, the protective films 204 are provided over an insulating film (here, the insulating film 134) provided over the thin film transistors 100a and 100b so as to surround the semiconductor films 106 having island shapes, which are included in the thin film transistors 100a and 100b. In addition, the protective films 204 are provided over the insulating film formed above the semiconductor films 106 so as not to overlap with the semiconductor films 106 in a direction perpendicular to a surface of the substrate 102.

Further, FIGS. 25A and 25B show the case of providing the second conductive films 114 so as to cover end portions of the semiconductor films 106. By providing the second conductive films 114 so as to overlap with the protective films 204, even in the case where the semiconductor device is stressed by, for example, being bent, the semiconductor films 106 are sufficiently prevented from being damaged by being bent. Note that a structure may be employed in which the second conductive films 114 are not provided and the protective films 204 are provided.

Thus, by providing the protective films 204 above the thin film transistors, even in the case where the semiconductor device is stressed, damages and breakages of the thin film transistors 100a and 100b can be efficiently reduced. In addition, in the case of providing the protective films above the thin film transistors, the thin film transistors are prevented from being adversely affected by steps (unevenness) due to the protective films, in the manufacturing process of a semiconductor device.

Note that the structure of a semiconductor device, which is described in this embodiment mode, can be combined with that described in any of the other embodiment modes.

Embodiment Mode 9

In this embodiment mode, an example of an application mode of a semiconductor device described in the above embodiment mode is described. Specifically, applications of a semiconductor device which can input and output data without contact is described with reference to drawings. The semiconductor device which can input and output data without contact is also referred to as an RFID tag, an ID tag, an IC tag, an IC chip, an RF tag, a wireless tag, an electronic tag, or a wireless chip depending on an application mode.

Figure 26A:
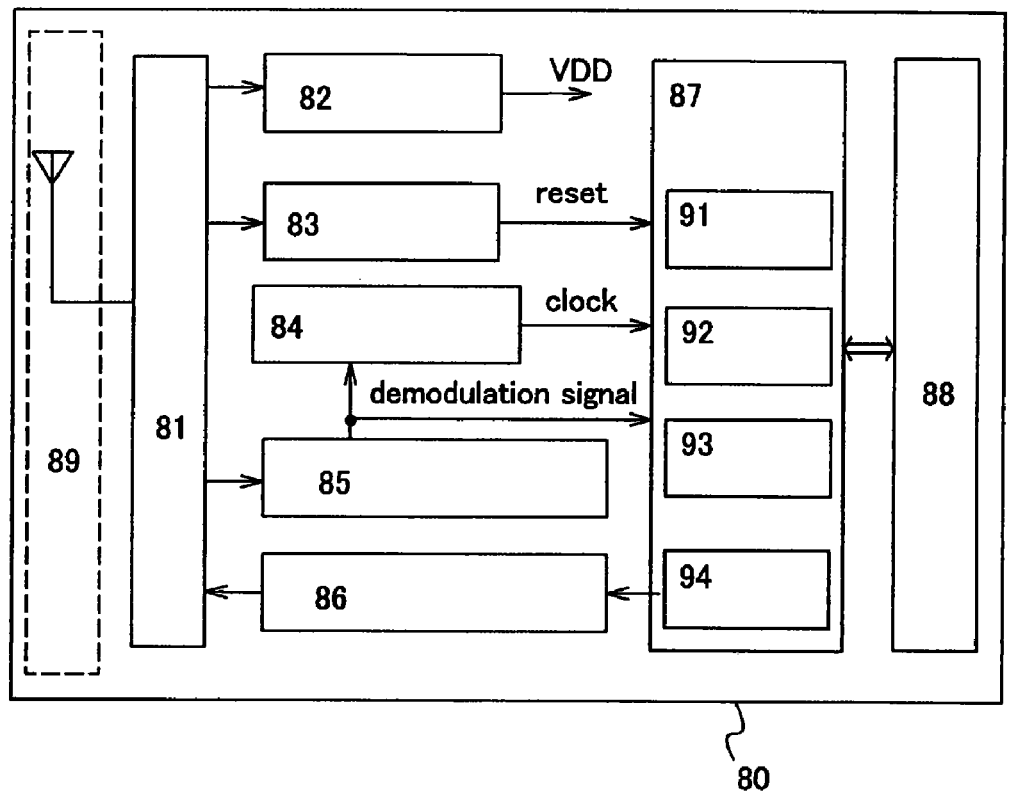
FIGS. 26A to 26C are views showing examples of an application mode of a semiconductor device of the present invention.

A semiconductor device 80 has a function of communicating data without contact, and includes a high frequency circuit 81, a power source circuit 82, a reset circuit 83, a clock generation circuit 84, a data demodulation circuit 85, a data modulation circuit 86, a control circuit 87 for controlling other circuits, a storage circuit 88, and an antenna 89 (FIG. 26A). The high frequency circuit 81 is a circuit which receives a signal from the antenna 89 and outputs a signal received by the data modulation circuit 86 from the antenna 89. The power source circuit 82 is a circuit which generates a power source potential from the received signal. The reset circuit 83 is a circuit which generates a reset signal. The clock generation circuit 84 is a circuit which generates various clock signals based on the received signal inputted from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are formed, for example. It is to be noted that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC circuit is a circuit which detects the presence or absence of a transmission error or the like based on the determined code.

Next, an example of operation of the above semiconductor device is explained. First, a radio signal is received by the antenna 89. The radio signal is transmitted to the power source circuit 82 via the high frequency circuit 81, and a high power source potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter, a demodulated signal). Furthermore, the demodulated signal and a signal transmitted through the reset circuit 83 and the clock generation circuit 84 via the high frequency circuit 81 are transmitted to the control circuit 87. The signal transmitted to the control circuit 87 is analyzed by the code extraction circuit 91, the code determination circuit 92, the CRC determination circuit 93, and the like. Then, in accordance with the analyzed signal, information of the semiconductor device, which is stored in the storage circuit 88, is outputted. The outputted information of the semiconductor device is encoded through the output unit circuit 94. Furthermore, the encoded information of the semiconductor device 80 is transmitted by the antenna 89 as a radio signal through the data modulation circuit 86. It is to be noted that a low power source potential (hereinafter, VSS) is common among a plurality of circuits included in the semiconductor device 80, and VSS can be GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power source voltage to each circuit by an electromagnetic wave without a power source (battery) mounted, or by an electromagnetic wave and a power source (battery) with the power source (battery) mounted.

Even when the obtained semiconductor device is bent, damages of the semiconductor device can be prevented and therefore reliability thereof can be improved by applying the structure described in any of the above embodiment modes to the high frequency circuit 81, the power source circuit 82, the reset circuit 83, the clock generation circuit 84, the data demodulation circuit 85, the data modulation circuit 86, and the control circuit 87 for controlling other circuits.

Figure 26B:
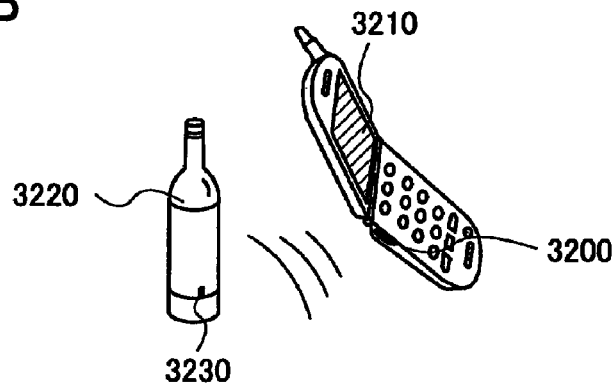
Figure 26C:
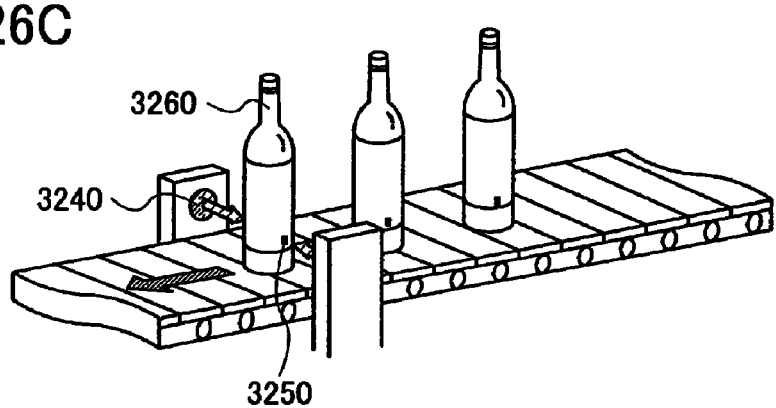

Next, an example of an application of a semiconductor device which can input and output data without contact is explained. A side face of a portable terminal including a display portion 3210 is provided with a reader/writer 3200, and a side face of an article 3220 is provided with a semiconductor device 3230 (FIG. 26B). When the reader/writer 3200 is held over the semiconductor device 3230 included in the article 3220, information on the article 3220, such as a raw material, the place of origin, an inspection result in each production process, the history of distribution, or an explanation of the article, is displayed on the display portion 3210. Furthermore, when a product 3260 is transported by a conveyor belt, the product 3260 can be inspected using a reader/writer 3240 and a semiconductor device 3250 attached to the product 3260 (FIG. 26C). Thus, by utilizing the semiconductor device for a system, information can be acquired easily, and improvement in functionality and added value of the system can be achieved. As described in the above embodiment mode, a transistor or the like included in a semiconductor device can be prevented from being damaged even when the semiconductor device is attached to an object having a curved surface, and a highly reliable semiconductor device can be provided. It is to be noted that the pressure bonding apparatus or the pressure bonding method described in the above embodiment mode may be used when the semiconductor device is attached to a product. By using the above pressure bonding apparatus or pressure bonding method, excessive pressure is prevented from being applied to the semiconductor device when the semiconductor device is attached to the product, and damage to the semiconductor device can be prevented.

In addition, as a signal transmission method in the above semiconductor device which can input and output data without contact, an electromagnetic coupling method, an electromagnetic induction method, a microwave method, or the like can be used. The transmission method may be appropriately selected by a practitioner in consideration of an intended use, and an optimum antenna may be provided in accordance with the transmission method.

In the case of employing, for example, an electromagnetic coupling method or an electromagnetic induction method (for example, a 13.56 MHz band) as the signal transmission method in the semiconductor device, electromagnetic induction caused by a change in magnetic field density is used. Therefore, the conductive film functioning as an antenna is formed into an annular shape (for example, a loop antenna) or a spiral shape (for example, a spiral antenna).

In the case of employing, for example, a microwave method (for example, a UHF band (860 to 960 MHz band), a 2.45 GHz band, or the like) as the signal transmission method in the semiconductor device, the shape such as a length of the conductive film functioning as an antenna may be appropriately set in consideration of a wavelength of an electromagnetic wave used for signal transmission. For example, the conductive film functioning as an antenna can be formed into a linear shape (for example, a dipole antenna), a flat shape (for example, a patch antenna), a ribbon-like shape, or the like. The shape of the conductive film functioning as an antenna is not limited to a linear shape, and the conductive film functioning as an antenna may be formed in a curved-line shape, a meander shape, or a combination thereof, in consideration of a wavelength of an electromagnetic wave. Whichever shape the conductive film functioning as an antenna is formed into, a damage to the element group, or the like can be prevented by controlling the pressure applied to the element group when the element group is attached to the substrate while monitoring the pressure applied to the element group so that excessive pressure is prevented from being applied as described in the above embodiment mode.

The conductive film functioning as an antenna is formed using a conductive material by a CVD method, a sputtering method, a printing method such as screen printing or gravure printing, a droplet discharging method, a dispenser method, a plating method, or the like. The conductive film is formed to have a single-layer structure or a stacked-layer structure of an element selected from aluminum (Al), titanium (Ti), silver (Ag), copper (Cu), gold (Au), platinum (Pt), nickel (Ni), palladium (Pd), tantalum (Ta), and molybdenum (Mo) or an alloy material or a compound material containing the element as its main component.

In the case of forming a conductive film functioning as an antenna by using, for example, a screen printing method, the conductive film can be formed by selectively printing a conductive paste in which conductive particles each having a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin contained in the conductive paste, one or a plurality of organic resins each functioning as a binder, a solvent, a dispersant, or a coating of the metal particle can be used. Typically, an organic resin such as an epoxy resin or a silicone resin can be used. When forming a conductive film, baking is preferably performed after the conductive paste is applied. For example, in the case of using fine particles (of which grain size is 1 nm to 100 nm inclusive) containing silver as its main component as a material of the conductive paste, a conductive film can be obtained by hardening the conductive paste by baking at a temperature of 150 to 300° C. Alternatively, fine particles containing solder or lead-free solder as its main component may be used; in this case, it is preferable to use a fine particle having a grain size of 20 μm or less. Solder or lead-free solder has an advantage such as low cost.

Besides the above-mentioned materials, ceramic, ferrite, or the like may be applied to an antenna. Furthermore, a material of which dielectric constant and magnetic permeability are negative in a microwave band (metamaterial) can be applied to an antenna.

In the case of applying an electromagnetic coupling method or an electromagnetic induction method, and placing a semiconductor device including an antenna in contact with a metal, a magnetic material having magnetic permeability is preferably interposed between the semiconductor device and the metal. In the case of placing a semiconductor device including an antenna in contact with a metal, an eddy current flows in the metal accompanying a change in a magnetic field, and a demagnetizing field generated by the eddy current impairs a change in a magnetic field and decreases a communication range. Therefore, an eddy current of the metal and a decrease in the communication range can be suppressed by interposing a material having magnetic permeability between the semiconductor device and the metal. It is to be noted that ferrite or a metal thin film having high magnetic permeability and little loss of high frequency wave can be used as the magnetic material.

It is to be noted that an applicable range of the flexible semiconductor device is wide in addition to the above, and the flexible semiconductor device can be applied to any product as long as it clarifies information such as the history of an object without contact and is useful for production, management, or the like. For example, the semiconductor device can be mounted on bills, coins, securities, certificates, bearer bonds, packing containers, books, recording media, personal belongings, vehicles, food, clothing, health products, commodities, medicine, electronic devices, and the like. Examples of them is explained with reference to FIGS. 27A to 27H.

Figure 27A:
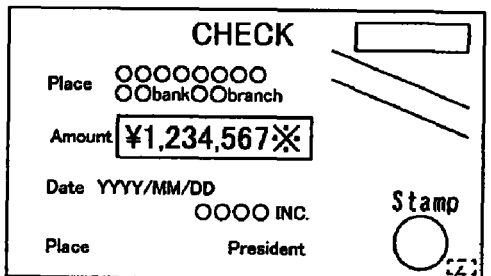
FIGS. 27A to 27H are views each showing an example of an application mode of a semiconductor device of the present invention.
Figure 27B:
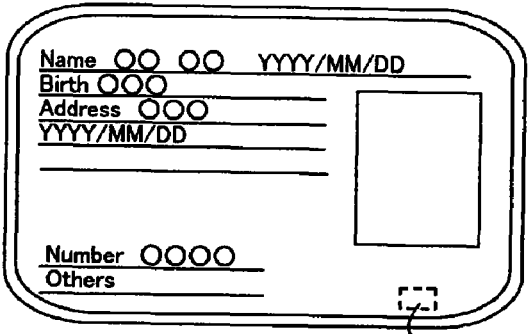
Figure 27C:
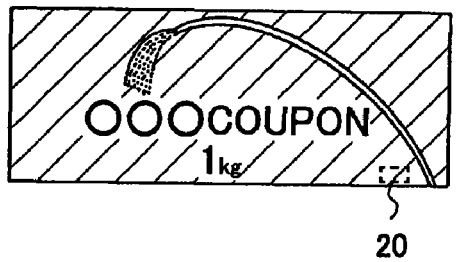
Figure 27D:
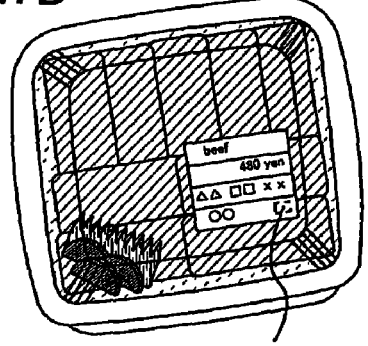
Figure 27E:
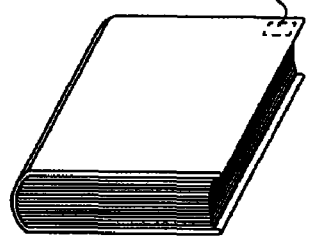
Figure 27F:
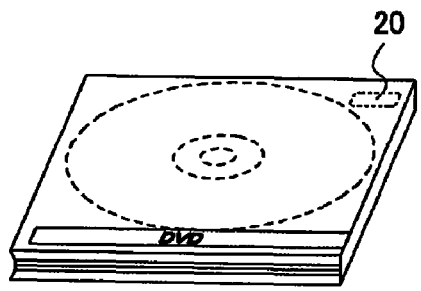
Figure 27G:
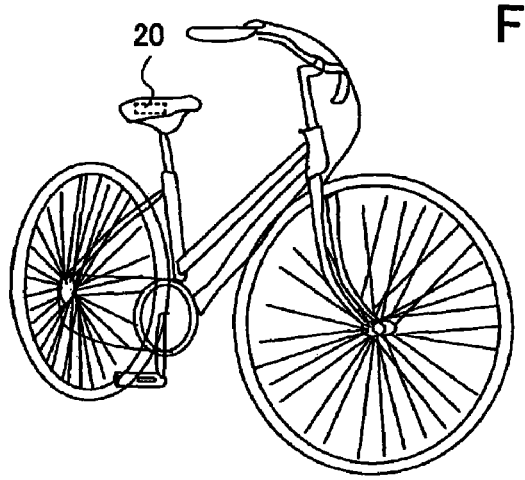
Figure 27H:
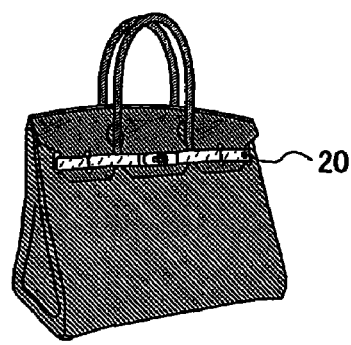

The bills and coins are money distributed to the market, and include one valid in a certain area (cash voucher), memorial coins, and the like. The securities refer to checks, certificates, promissory notes, and the like (FIG. 27A). The certificates refer to driver's licenses, certificates of residence, and the like (FIG. 27B). The bearer bonds refer to stamps, rice coupons, various gift certificates, and the like (FIG. 27C). The packing containers refer to wrapping paper for food containers and the like, plastic bottles, and the like (FIG. 27D). The books refer to hardbacks, paperbacks, and the like (FIG. 27E). The recording media refer to DVD software, video tapes, and the like (FIG. 27F). The vehicles refer to wheeled vehicles such as bicycles, ships, and the like (FIG. 27G). The personal belongings refer to bags, glasses, and the like (FIG. 27H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), cellular phones, and the like.

Forgery can be prevented by mounting the semiconductor device 20 on the bills, the coins, the securities, the certificates, the bearer bonds, or the like. The efficiency of an inspection system, a system used in a rental shop, or the like can be improved by mounting the semiconductor device 20 on the packing containers, the books, the recording media, the personal belongings, the food, the commodities, the electronic devices, or the like. Forgery or theft can be prevented by mounting the semiconductor device 20 on the vehicles, the health products, the medicine, or the like; further, in a case of the medicine, medicine can be prevented from being taken mistakenly. The semiconductor device 20 can be mounted on the foregoing article by being attached to the surface or being embedded therein. For example, in a case of a book, the semiconductor device 20 may be embedded in a piece of paper; in the case of a package made from an organic resin, the semiconductor device 20 may be embedded in the organic resin. By using a flexible semiconductor device having the structure described in the above embodiment modes, breakage or the like of an element included in the semiconductor device can be prevented even when the semiconductor device is mounted on paper or the like.

As described above, the efficiency of an inspection system, a system used in a rental shop, or the like can be improved by mounting the semiconductor device on the packing containers, the recording media, the personal belonging, the food, the clothing, the commodities, the electronic devices, or the like. In addition, by mounting the semiconductor device on the vehicles, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

Note that this embodiment mode can be freely combined with any of the above embodiment modes. That is, the structures of the semiconductor device, which are described in the aforementioned embodiment modes, can be applied to the semiconductor device described in this embodiment mode.

Embodiment Mode 10

In this embodiment mode, an example of the case where the semiconductor device described in Embodiment Modes 1 to 8 is applied to a display device is described with reference to drawings.

Figure 28A:
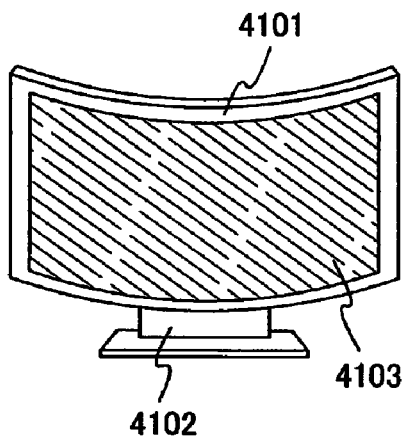
FIGS. 28A to 28F are views each showing an example of an application mode of a semiconductor device of the present invention.

FIG. 28A shows a display that includes a main body 4101, a supporting base 4102, and a display portion 4103. The display portion 4103 is formed using a flexible substrate to achieve a lightweight and thin display. The display portion 4103 can be curved and detached from the supporting base 4102 so that the display is hung on a curved wall. When the semiconductor device having the structure described in any of Embodiment Modes 1 to 8 is used for the display portion 4103, a circuit for driving the display portion 4103, and the like, a flexible and highly reliable display can be manufactured.

Figure 28B:
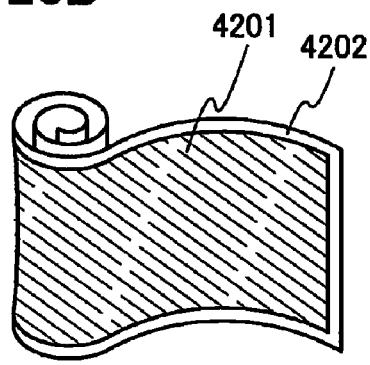

FIG. 28B shows a display that can be wound, which includes a main body 4201, a display portion 4202, and the like. The main body 4201 and the display portion 4202 are formed using a flexible substrate to carry the display in a bent or wound state. When the semiconductor device having the structure described in any of Embodiment Modes 1 to 8 is used for the display portion 4202, a circuit for driving the display portion 4202, and the like, a flexible and highly reliable display can be manufactured.

Figure 28C:
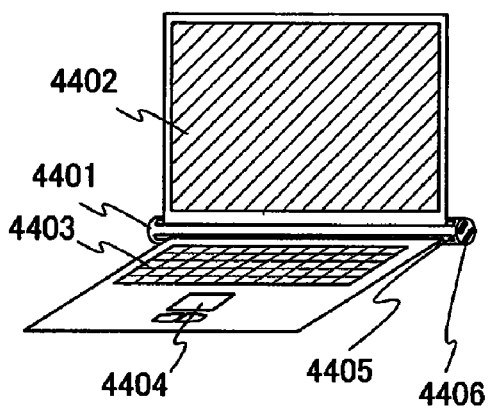

FIG. 28C shows a sheet computer that includes a main body 4401, a display portion 4402, a keyboard 4403, a touch pad 4404, an external connecting port 4405, a power source plug 4406, and the like. The display portion 4402 is formed using a flexible substrate to achieve a lightweight and thin computer. In addition, the display portion 4402 can be wound and stored in the main body if a portion of the power source plug 4406 is provided with a storage space. When the semiconductor device having the structure described in any of Embodiment Modes 1 to 8 is used for the display portion 4402, a circuit for driving the display portion 4402, and the like, a flexible and highly reliable thin computer can be manufactured.

Figure 28D:
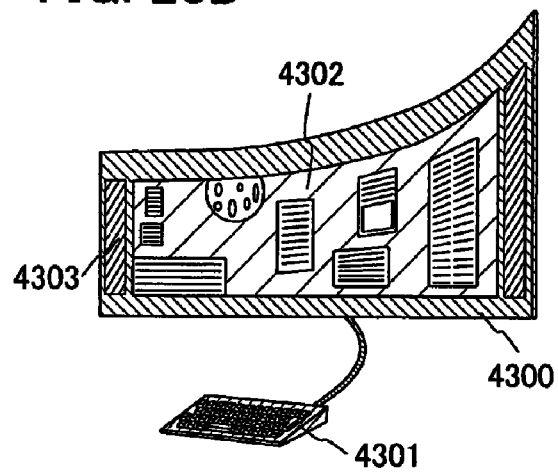

FIG. 28D shows a display device having a large display portion with a size of 20 to 80 inches, which includes a main body 4300, a keyboard 4301 that is an operating portion, a display portion 4302, a speaker 4303, and the like. The display portion 4302 is formed using a flexible substrate, and the main body 4300 can be carried in a bent or wound state with the keyboard 4301 detached. When the semiconductor device having the structure described in any of Embodiment Modes 1 to 8 is used for the display portion 4302, a circuit for driving the display portion 4302, and the like, a flexible and highly reliable large-sized display device can be manufactured.

Figure 28E:
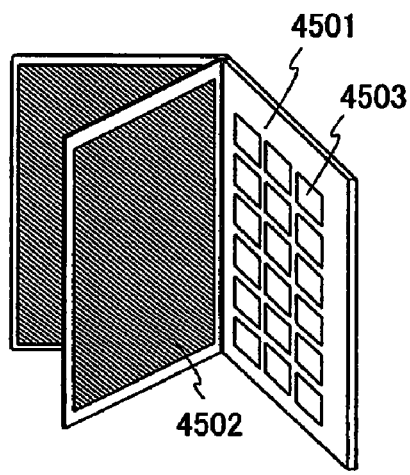

FIG. 28E shows an electronic book that includes a main body 4501, a display portion 4502, an operating key 4503, and the like. A modem may be incorporated in the main body 4501. The display portion 4502 is formed using a flexible substrate to be bent. Further, the display portion 4502 can display a moving image as well as a still image such as a character. When the semiconductor device having the structure described in any of Embodiment Modes 1 to 8 is used for the display portion 4502, a circuit for driving the display portion 4502, and the like, a flexible and highly reliable electronic book can be manufactured.

Figure 28F:
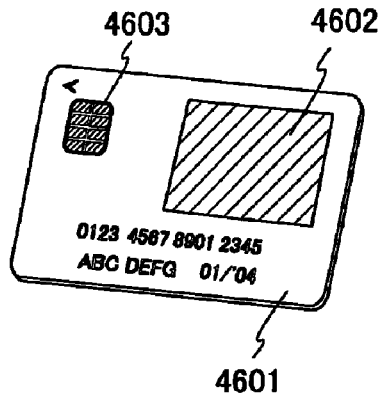

FIG. 28F shows an IC card that includes a main body 4601, a display portion 4602, a connecting terminal 4603, and the like. Since the display portion 4602 is formed using a flexible substrate to be a lightweight and thin sheet type, it can be attached onto a card surface. When the IC card can receive data without contact, information obtained from outside can be displayed on the display portion 4602. When the semiconductor device having the structure described in any of Embodiment Modes 1 to 8 is used for the display portion 4602, a circuit for driving the display portion 4602, and the like, a flexible and highly reliable IC card can be manufactured.

As described above, the applicable range of the invention is so wide that the invention can be applied to electronic devices and information displaying means of various fields.

This application is based on Japanese Patent Application serial no. 2006-256902 filed in Japan Patent Office on 22 Sep. 2006, the entire contents of which are hereby incorporated by reference.

What is claimed is:
1. A semiconductor device comprising:
a semiconductor film including a channel formation region, a first impurity region and a second impurity region, which is provided over a substrate;
a first conductive film provided over the channel formation region with a gate insulating film interposed therebetween;
a first interlayer insulating film provided to cover the first conductive film;
a second conductive film provided over the first interlayer insulating film to overlap with at least part of the first impurity region;
a second interlayer insulating film provided over the second conductive film;
a third conductive film provided over the second interlayer insulating film; and
a fourth conductive film provided over the second interlayer insulating film,
wherein the third conductive film is electrically connected to the first impurity region through a first opening formed in the first interlayer insulating film and the second interlayer insulating film,
wherein the fourth conductive film is electrically connected to the second impurity region through a second opening formed in the first interlayer insulating film and the second interlayer insulating film.

2. The semiconductor device according to claim 1, wherein the second conductive film covers at least an end portion of the first impurity region with the first interlayer insulating film interposed therebetween.

3. The semiconductor device according to claim 1, wherein the first conductive film and the second conductive film are formed of the same material.

4. The semiconductor device according to claim 1, wherein the second opening is formed through the second conductive film.

5. The semiconductor device according to claim 1, further comprising:
  a protective film; and
  an insulating film over the protective film,
  wherein the semiconductor film is provided over the insulating film.

6. The semiconductor device according to claim 5, wherein the protective film is provided to surround the semiconductor film.

7. The semiconductor device according to claim 1, further comprising:
  a third interlayer insulating film provided over the third conductive film and the fourth conductive film; and
  a protective film provided over the third interlayer insulating film, so as to surround the semiconductor film.

8. A display device, an RFID tag, an ID tag, an IC ship, an RF tag, a wireless tag, an electronic tag or a wireless chip comprising the semiconductor device according to claim 1, wherein the display device is a display, a computer, an electronic book or IC card.

9. A semiconductor device comprising:
  a semiconductor film including a channel formation region, a first impurity region and a second impurity region, which is provided over a substrate;
  a first conductive film provided over the channel formation region with a gate insulating film interposed therebetween;
  a first interlayer insulating film provided to cover the first conductive film;
  a second conductive film provided over the first interlayer insulating film to overlap with at least part of the first impurity region;
  a second interlayer insulating film provided over the second conductive film;
  a third conductive film provided over the second interlayer insulating film;
  a fourth conductive film provided over the second interlayer insulating film;
  a third interlayer insulating film provided to cover the third conductive film and the fourth conductive film; and
  an island-shaped protective film provided over the third interlayer insulating film,
  wherein the third conductive film is electrically connected to the first impurity region through a first opening formed in the first interlayer insulating film and the second interlayer insulating film,
  wherein the fourth conductive film is electrically connected to the second impurity region through a second opening formed in the first interlayer insulating film and the second interlayer insulating film; and
  wherein the semiconductor film and the island-shaped protective film overlap with each other.

10. The semiconductor device according to claim 9, wherein the second conductive film covers at least an end portion of the first impurity region with the first interlayer insulating film interposed therebetween.

11. The semiconductor device according to claim 9, wherein the first conductive film and the second conductive film are formed of the same material.

12. The semiconductor device according to claim 9, wherein the second opening is formed through the second conductive film.

13. The semiconductor device according to claim 9, wherein at least part of the island-shaped protective film is provided over the semiconductor film.

14. A display device, an RFID tag, an ID tag, an IC ship, an RF tag, a wireless tag, an electronic tag or a wireless chip comprising the semiconductor device according to claim 9, wherein the display device is a display, a computer, an electronic book or IC card.

* * * * *